US009252170B2

(12) United States Patent
Tomita

(10) Patent No.: US 9,252,170 B2
(45) Date of Patent: Feb. 2, 2016

(54) SOLID-STATE IMAGING DEVICE AND LINE SENSOR

(71) Applicant: Kabushiki Kaisha Toshiba, Minato-ku (JP)

(72) Inventor: Ken Tomita, Iwate (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 195 days.

(21) Appl. No.: 14/188,818

(22) Filed: Feb. 25, 2014

(65) Prior Publication Data

US 2015/0028392 A1 Jan. 29, 2015

(30) Foreign Application Priority Data

Jul. 25, 2013 (JP) ................................ 2013-154542

(51) Int. Cl.
*H01L 27/148* (2006.01)
*H01L 27/146* (2006.01)

(52) U.S. Cl.
CPC .... *H01L 27/14603* (2013.01); *H01L 27/14609* (2013.01); *H01L 27/14614* (2013.01)

(58) Field of Classification Search
USPC .................... 257/222, 225, 291, 292; 438/75
See application file for complete search history.

(56) References Cited

U.S. PATENT DOCUMENTS 4,987,466 A 1/1991 Shibata et al.
6,207,981 B1 3/2001 Hatano et al.
7,414,276 B2 8/2008 Monoi
2009/0039395 A1* 2/2009 Tachikawa ........ H01L 27/14812 257/225

FOREIGN PATENT DOCUMENTS

JP 2-58271 2/1990
JP 8-264745 10/1996
JP 11-154745 6/1999
JP 2005-50951 2/2005

* cited by examiner

*Primary Examiner* — Errol Fernandes

(74) *Attorney, Agent, or Firm* — Oblon, McClelland, Maier & Neustadt, L.L.P.

(57) ABSTRACT

Certain embodiments provide a solid-state imaging device including a pixel portion, a charge storage portion, a first transfer gate portion, a charge detecting portion, a second transfer gate portion, and an offset gate portion. The charge storage portion stores the electrical charges generated in the pixel portion. The first transfer gate portion transfers electrical charges from the pixel portion to the charge storage portion, and the second transfer gate portion transfers the electrical charges from the charge storage portion to the charge detecting portion. The offset gate portion is provided between the second transfer gate portion and the charge detecting portion and is applied with a predetermined constant voltage. This offset gate portion includes an offset gate layer that has a plurality of projections formed at positions adjacent to the second transfer gate portion and an offset gate electrode.

15 Claims, 18 Drawing Sheets

X (+)
Y (+)
15b
15c
14
E
29
26b
15a
15d
26
N+
26a
27
To charge detecting portion

SOLID-STATE IMAGING DEVICE AND LINE SENSOR

CROSS REFERENCE TO RELATED APPLICATIONS

This application is based upon and claims the benefit of priority from the prior Japanese Patent Application No. 2013-154542 filed in Japan on Jul. 25, 2013; the entire contents of which are incorporated herein by reference.

FIELD

Embodiments described herein relate generally to a solid-state imaging device and a line sensor.

BACKGROUND

As a conventional solid-state imaging device, a solid-state imaging device in which a charge storage portion is formed between each of the pixel portions that generates electrical charges according to an amount of received light and a charge detecting portion to which the electrical charges generated in the pixel portions are transferred and which generates a signal voltage according to the amount of the transferred electrical charges so as to enable resolution to be switched is known. In this solid-state imaging device, an offset gate portion is formed between the charge storage portion and the charge detecting portion so as to improve the detection accuracy of the signal voltage generated in the charge detecting portion.

The offset gate portion includes an N type offset gate layer formed on a surface of a P type well layer formed on a surface of a semiconductor substrate and an offset gate electrode formed on the offset gate layer.

Since a plurality of pixel portions are connected to such an offset gate portion with the charge storage portion interposed, the offset gate layer is formed by injecting impurities over a wide range of regions of the surface of the well layer.

However, when the offset gate layer is formed over a wide range of regions, a deepest portion of electric potential is formed in a central portion of the offset gate layer. That is, when the offset gate layer is formed over a wide range of regions, a potential dip is formed in the electric potential of the central portion of the offset gate layer. Thus, the transfer characteristics of the electrical charges in the offset gate portion may deteriorate.

Further, when a relative position of the offset gate electrode in relation to the position of the offset gate layer is shifted, a potential dip or a potential barrier is formed in the electric potential between the offset gate portion and a transfer gate portion formed between the offset gate portion and a charge storage layer. Thus, the transfer characteristics of the electrical charges between the offset gate portion and the transfer gate portion may deteriorate.

BRIEF DESCRIPTION OF THE DRAWINGS

FIGS. 5A and 5B are diagrams for describing electric potential formed in the solid-state imaging device according to the first embodiment, in which FIG. 5A is the same cross-sectional view of the solid-state imaging device as FIG. 2, and FIG. 5B is a diagram illustrating electric potential in the cross-section illustrated in FIG. 5A;

FIGS. 8A to 8C are diagrams for describing a relation between a formation position of an offset gate electrode and electric potentials between the offset gate electrode and a second transfer electrode of a second transfer gate portion in a conventional solid-state imaging device, in which FIG. 8A is a schematic plan view illustrating main components of the offset gate portion at an enlarged scale, FIG. 8B is a cross-sectional view along one-dot chain line B-B' of FIG. 8A, and FIG. 8C illustrates electric potential in the cross-section of FIG. 8B;

FIGS. 9A to 9C are diagrams for describing a relation between a formation position of an offset gate electrode and electric potentials between the offset gate electrode and a second transfer electrode of a second transfer gate portion in a conventional solid-state imaging device, in which FIG. 9A is a schematic plan view illustrating main components of the offset gate portion at an enlarged scale, FIG. 9B is a cross-sectional view along one-dot chain line B-B' of FIG. 9A, and FIG. 9C illustrates electric potential in the cross-section of FIG. 9B;

FIGS. 10A to 10C are diagrams for describing a relation between a formation position of an offset gate electrode and electric potentials between the offset gate electrode and a second transfer electrode of a second transfer gate portion in a conventional solid-state imaging device, in which FIG. 10A is a schematic plan view illustrating main components of the offset gate portion at an enlarged scale, FIG. 10B is a cross-sectional view along one-dot chain line B-B' of FIG. 10A, and FIG. 10C illustrates electric potential in the cross-section of FIG. 10B;

FIGS. 11A to 11C are diagrams for describing a relation between a formation position of an offset gate electrode and electric potentials between the offset gate electrode and a second transfer electrode of a second transfer gate portion in the solid-state imaging device according to the first embodiment, in which FIG. 11A is a schematic plan view illustrating main components of the offset gate portion at an enlarged scale, FIG. 11B is a cross-sectional view along one-dot chain line B-B' of FIG. 11A, and FIG. 11C illustrates electric potential in the cross-section of FIG. 11B;

FIGS. 12A to 12C are diagrams for describing a relation between a formation position of an offset gate electrode and electric potentials between the offset gate electrode and a second transfer electrode of a second transfer gate portion in the solid-state imaging device according to the first embodiment, in which FIG. 12A is a schematic plan view illustrating main components of the offset gate portion at an enlarged scale, FIG. 12B is a cross-sectional view along one-dot chain line B-B' of FIG. 12A, and FIG. 12C illustrates electric potential in the cross-section of FIG. 12B;

FIGS. 13A to 13C are diagrams for describing a relation between a formation position of an offset gate electrode and electric potentials between the offset gate electrode and a second transfer electrode of a second transfer gate portion in the solid-state imaging device according to the first embodiment, in which FIG. 13A is a schematic plan view illustrating main components of the offset gate portion at an enlarged scale, FIG. 13B is a cross-sectional view along one-dot chain line B-B' of FIG. 13A, and FIG. 13C illustrates electric potential in the cross-section of FIG. 13B;

FIGS. 16A to 16C are diagrams for describing a relation between a formation position of an offset gate electrode and electric potentials between the offset gate electrode and a second transfer electrode of a second transfer gate portion in the solid-state imaging device according to the second embodiment, in which FIG. 16A is a schematic plan view illustrating main components of the offset gate portion at an enlarged scale, FIG. 16B is a cross-sectional view along one-dot chain line B-B' of FIG. 16A, and FIG. 16C illustrates electric potential in the cross-section of FIG. 16B;

FIGS. 17A to 17C are diagrams for describing a relation between a formation position of an offset gate electrode and electric potentials between the offset gate electrode and a second transfer electrode of a second transfer gate portion in the solid-state imaging device according to the second embodiment, in which FIG. 17A is a schematic plan view illustrating main components of the offset gate portion at an enlarged scale, FIG. 17B is a cross-sectional view along one-dot chain line B-B' of FIG. 17A, and FIG. 17C illustrates electric potential in the cross-section of FIG. 17B;

FIGS. 18A to 18C are diagrams for describing a relation between a formation position of an offset gate electrode and electric potentials between the offset gate electrode and a second transfer electrode of a second transfer gate portion in the solid-state imaging device according to the second embodiment, in which FIG. 18A is a schematic plan view illustrating main components of the offset gate portion at an enlarged scale, FIG. 18B is a cross-sectional view along one-dot chain line B-B' of FIG. 18A, and FIG. 18C illustrates electric potential in the cross-section of FIG. 18B;

DETAILED DESCRIPTION

Figure 1:
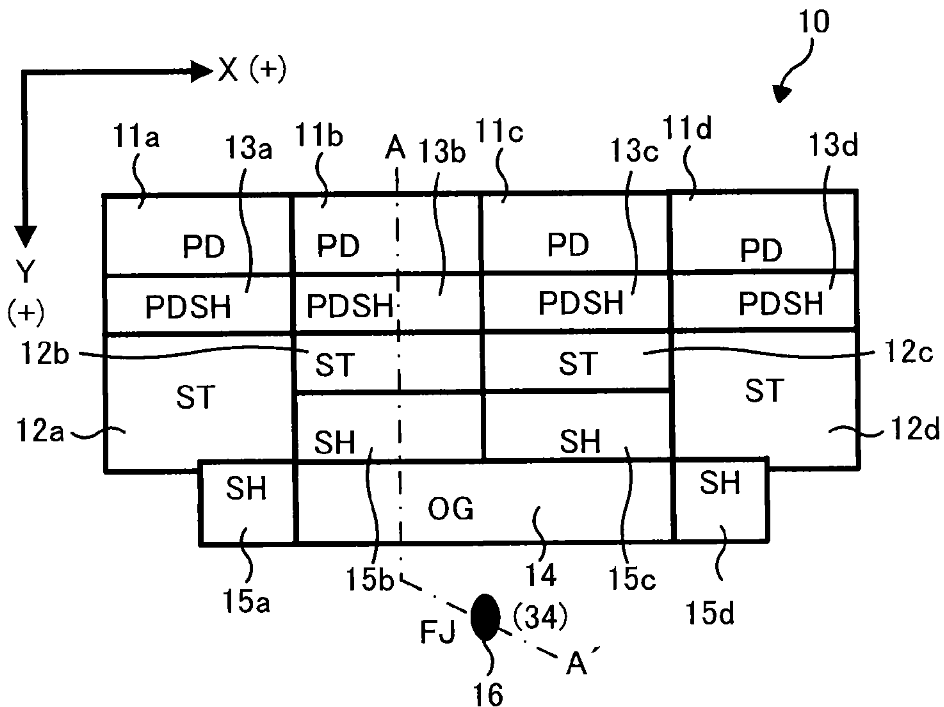
FIG. 1 is a plan view schematically illustrating main components of a solid-state imaging device according to a first embodiment.

Certain embodiments provide a solid-state imaging device including a pixel portion, a charge storage portion, a first transfer gate portion, a charge detecting portion, a second transfer gate portion, and an offset gate portion. The pixel portion generates electrical charges according to an amount of received incident light. The charge storage portion stores the electrical charges generated in the pixel portion. The first transfer gate portion reads the electrical charges from the pixel portion and transfers the electrical charges to the charge storage portion. The electrical charges stored in the charge storage portion are transferred to the charge detecting portion, which causes a voltage drop corresponding to the amount of the transferred electrical charges to occur. The second transfer gate portion reads the electrical charges stored in the charge storage portion and transfers the electrical charges to the charge detecting portion. The offset gate portion is provided between the second transfer gate portion and the charge detecting portion, and a predetermined constant voltage is applied to the offset gate portion. This offset gate portion includes an offset gate layer that is provided on a surface of a semiconductor substrate and has a plurality of projections formed at positions adjacent to the second transfer gate portion and an offset gate electrode formed on a surface of the semiconductor substrate, including the offset gate layer.

Certain embodiments provide a solid-state imaging device including a plurality of pixel portions, a plurality of charge storage portions, a plurality of first transfer gate portions, a charge detecting portion, a plurality of second transfer gate portions, and an offset gate portion. Each of the plurality of pixel portions generates electrical charges according to an amount of received incident light. The plurality of pixel portions are arranged in a line form. The plurality of charge storage portions are arranged in a line form in parallel to an arrangement direction of the plurality of pixel portions. Each of the plurality of charge storage portions stores the electrical charges generated in the pixel portion. The plurality of first transfer gate portions read the electrical charges from the plurality of pixel portions and transfer the electrical charges to the plurality of charge storage portions. The electrical charges stored in the plurality of charge storage portions are transferred to the charge detecting portion. The charge detecting portion causes a voltage drop corresponding to the amount of the transferred electrical charges to occur. The second transfer gate portion is provided between the plurality of charge storage portions and the charge detecting portion so as to read the electrical charges stored in the plurality of charge storage portions and transfer the electrical charges to the charge detecting portion. The offset gate portion has a shape which has long sides extending in a longitudinal direction which is the arrangement direction of the plurality of pixel portions and short sides extending in a direction substantially perpendicular to the longitudinal direction. The offset gate portion is provided between the plurality of second transfer gate portions and the charge detecting portion so that the long sides and the short sides are adjacent to the plurality of second transfer gate portions. A predetermined constant voltage is applied to the offset gate portion. The offset gate portion includes an offset gate layer that is provided on a surface of a semiconductor substrate and has a plurality of projections formed at positions of the long sides of the offset gate portion adjacent to the second transfer gate portion and an offset gate electrode formed on a surface of the semiconductor substrate, including the offset gate layer.

Certain embodiments provide a solid-state imaging device including a pixel portion, a charge detecting portion, a transfer gate portion, and an offset gate portion. The pixel portion generates electrical charges according to an amount of received incident light. The electrical charges generated in the pixel portion are transferred to the charge detecting portion, and the charge detecting portion causes a voltage drop corresponding to the amount of the transferred electrical charges to occur. The transfer gate portion reads the electrical charges stored in the pixel portion and transfers the electrical charges to the charge detecting portion. The offset gate portion is provided between the transfer gate portion and the charge detecting portion, and a predetermined constant voltage is applied to the offset gate portion. The offset gate portion includes an offset gate layer that is provided on a surface of a semiconductor substrate and has a plurality of projections formed at positions adjacent to the transfer gate portion and an offset gate electrode provided on a surface of the semiconductor substrate, including the offset gate layer.

Certain embodiments provide a line sensor including a circuit board, a plurality of solid-state imaging devices, a light guiding member, and a lens array. The plurality of solid-state imaging devices are disposed in a straight line form on a surface of the circuit board. The light guiding member is disposed above the surface of the circuit board so as to emit light to a subject. The lens array is disposed above the surface of the circuit board so as to focus the light reflected from the subject on the plurality of solid-state imaging devices. In this line sensor, each of the plurality of solid-state imaging devices includes a pixel portion, a charge storage portion, a first transfer gate portion, a charge detecting portion, a second transfer gate portion, and an offset gate portion. The pixel portion generates electrical charges according to an amount of received incident light. The charge storage portion stores the electrical charges generated in the pixel portion. The first transfer gate portion reads the electrical charges from the pixel portion and transfers the electrical charges to the charge storage portion. The electrical charges stored in the charge storage portion are transferred to the charge detecting portion, which causes a voltage drop corresponding to the amount of the transferred electrical charges to occur. The second transfer gate portion reads the electrical charges stored in the charge storage portion and transfers the electrical charges to the charge detecting portion. The offset gate portion is provided between the second transfer gate portion and the charge detecting portion, and a predetermined constant voltage is applied to the offset gate portion. This offset gate portion includes an offset gate layer that is provided on a surface of a semiconductor substrate and has a plurality of projections formed at positions adjacent to the second transfer gate portion and an offset gate electrode formed on a surface of the semiconductor substrate, including the offset gate layer.

Hereinafter, a solid-state imaging device and a line sensor according to embodiments will be described.

First Embodiment

FIG. 1 is a plan view schematically illustrating main components of a solid-state imaging device 10 according to a first embodiment. The solid-state imaging device 10 of the first embodiment has a configuration in which a plurality of cells each composed of four pixels are arranged in a line. Embodiments are not limited to a 4-pixel-1-cell type solid-state imaging device. The number of pixels included in one cell may be four pixels or more and may be eight pixels, for example.

In the solid-state imaging device 10 illustrated in FIG. 1, four pixel portions (PDs) 11*a*, 11*b*, 11*c*, and 11*d* are arranged in a line. In the following description, four pixel portions 11*a*, 11*b*, 11*c*, and 11*d* are referred to as a first pixel portion 11*a*, a second pixel portion 11*b*, a third pixel portion 11*c*, and a fourth pixel portion 11*d* in that order from the left side of the drawing. Moreover, a direction parallel to the line of the pixel portions 11*a*, 11*b*, 11*c*, and 11*d* is referred to as an X direction, and a direction directed from the pixel portion 11*a* to the pixel portion 11*d* is referred to as an X(+) direction. Moreover, a direction perpendicular to the X direction is referred to as a Y direction, and a direction away from the respective pixel portions 11*a*, 11*b*, 11*c*, and 11*d* is referred to as a Y(+) direction. That is, the four pixel portions 11*a*, 11*b*, 11*c*, and 11*d* are arranged along the X direction in that order toward the X(+) direction. The respective pixel portions 11*a*, 11*b*, 11*c*, and 11*d* are formed so that the longitudinal direction of each of the pixel portions 11*a*, 11*b*, 11*c*, and 11*d* extends in the X direction.

Each of the pixel portions 11*a*, 11*b*, 11*c*, and 11*d* receives light (incident light) irradiated to this region and generates an amount of electrical charges corresponding to the amount of received light.

Although each of the pixel portions 11*a*, 11*b*, 11*c*, and 11*d* practically has a polygonal shape of which the longitudinal direction extends in the X direction, each pixel portion has a polygonal shape approximate to a rectangular shape of which the longitudinal direction extends in the X direction. Thus, in FIG. 1 described above and the respective drawings to be described later, the pixel portions 11*a*, 11*b*, 11*c*, and 11*d* are depicted as having a rectangular shape. Hereinafter, the pixel portions 11*a*, 11*b*, 11*c*, and 11*d* will be described as having a rectangular shape.

A first charge storage portion (ST) 12*a* is provided at a position shifted in the Y(+) direction in relation to the first pixel portion 11*a*. Similarly, a second charge storage portion (ST) 12*b* is provided at a position shifted in the Y(+) direction in relation to the second pixel portion 11*b*, a third charge storage portion (ST) 12*c* is provided at a position shifted in the Y(+) direction in relation to the third pixel portion 11*c*, and a fourth charge storage portion (ST) 12*d* is provided at a position shifted in the Y(+) direction in relation to the fourth pixel portion 11*d*. These charge storage portions 12*a*, 12*b*, 12*c*, and 12*d* are provided in a line along an arrangement direction (X direction) of the pixel portions 11*a*, 11*b*, 11*c*, and 11*d*.

The electrical charges generated in the corresponding pixel portions 11*a*, 11*b*, 11*c*, and 11*d* are transferred to the charge storage portions 12*a*, 12*b*, 12*c*, and 12*d* which temporarily store the transferred electrical charges. By providing such regions, resolution can be switched.

First transfer gate portions (PDSHs) 13*a*, 13*b*, 13*c*, and 13*d* are provided between the corresponding pixel portions 11*a*, 11*b*, 11*c*, and 11*d* and the charge storage portions 12*a*, 12*b*, 12*c*, and 12*d*, respectively.

The first transfer gate portions 13*a*, 13*b*, 13*c*, and 13*d* read the electrical charges generated in the pixel portions 11*a*, 11*b*, 11*c*, and 11*d* and transfer the electrical charges to the charge storage portions 12*a*, 12*b*, 12*c*, and 12*d* corresponding to the pixel portions 11*a*, 11*b*, 11*c*, and 11*d*, respectively.

An offset gate portion (OG) 14 having a shape of which the longitudinal direction extends in the X direction is provided at a position shifted in the Y(+) direction in relation to the second and third charge storage portions 12*b* and 12*c*.

A predetermined constant voltage V0 (for example, V0=0 V) is applied to the offset gate portion 14. Since a constant voltage is applied in this manner, the offset gate portion 14 improves the reading accuracy of a charge detecting portion 16 to be described later, reading a signal voltage.

Although the offset gate portion 14 practically has a polygonal shape of which the longitudinal direction extends in the X direction, the offset gate portion may a polygonal shape approximate to a rectangular shape. Thus, in FIG. 1 described above and the respective drawings to be described later, the offset gate portion 14 is depicted as having a rectangular shape. Hereinafter, the offset gate portion 14 will be described as having a rectangular shape.

Second transfer gate portions (SHs) 15*b* and 15*c* are provided between one long side that forms the shape of the offset gate portion 14 and the second and third charge storage portions 12*b* and 12*c*. Moreover, a second transfer gate portion (SH) 15*a* is provided between one short side that forms the shape of the offset gate portion 14 and the first charge storage portion 12*a*, and a second transfer gate portion (SH) 15*d* is provided between the other short side facing one short side of the offset gate portion 14 and the fourth charge storage portion 12*d*.

That is, the second and third charge storage portions 12*b* and 12*c* are connected to the long side of the offset gate portion 14 via the second transfer gate portions 15*b* and 15*c*, and the first and fourth charge storage portions 12*a* and 12*d* are connected to the short sides of the offset gate portion 14 via the second transfer gate portions 15*a* and 15*d*.

The second transfer gate portions 15*a*, 15*b*, 15*c*, and 15*d* read the electrical charges stored in the charge storage portions 12*a*, 12*b*, 12*c*, and 12*d* and transfer the electrical charges to a charge detecting portion 16 to be described later via the offset gate portion 14.

A charge detecting portion (FJ) 16 which is a floating junction is provided at a position adjacent to the other long side that faces one long side that forms the shape of the offset gate portion 14.

The charge detecting portion 16 is a region in which a voltage drop corresponding to the amount of the electrical charges transferred to this region is caused to occur and the voltage drop occurred is read as a signal voltage.

Figure 2:
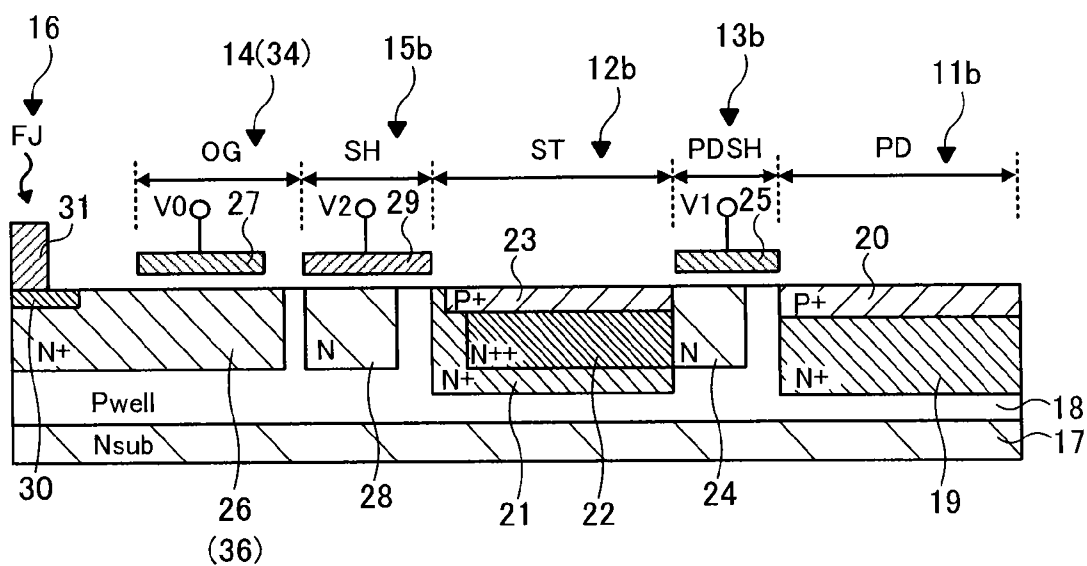
FIG. 2 is a cross-sectional view of the solid-state imaging device along one-dot chain line A-A' of FIG. 1.

FIG. 2 is a cross-sectional view of the solid-state imaging device 10 along one-dot chain line A-A' of FIG. 1. In FIG. 2, a cross-section that passes the second pixel portion 11*b* and the second charge storage portion 12*b* is illustrated as an example of the cross-sectional view of the solid-state imaging device 10 according to the present embodiment.

As illustrated in FIG. 2, the second pixel portion (PD) 11*b*, the first transfer gate portion (PDSH) 13*b*, the second charge storage portion (ST) 12*b*, the second transfer gate portion (SH) 15*b*, the offset gate portion (OG) 14, and the charge detecting portion (FJ) 16 are provided in a P type well layer 18 formed in an N type semiconductor substrate 17, for example.

In the second pixel portion 11*b*, a light receiving layer 19 is formed on a surface of the well layer 18. The light receiving layer 19 is an N+ type impurity layer, for example.

A shield layer 20 that shields the light receiving layer 19 is provided on a surface of the light receiving layer 19. The shield layer 20 is a P+ type impurity layer, for example.

Figure 3:
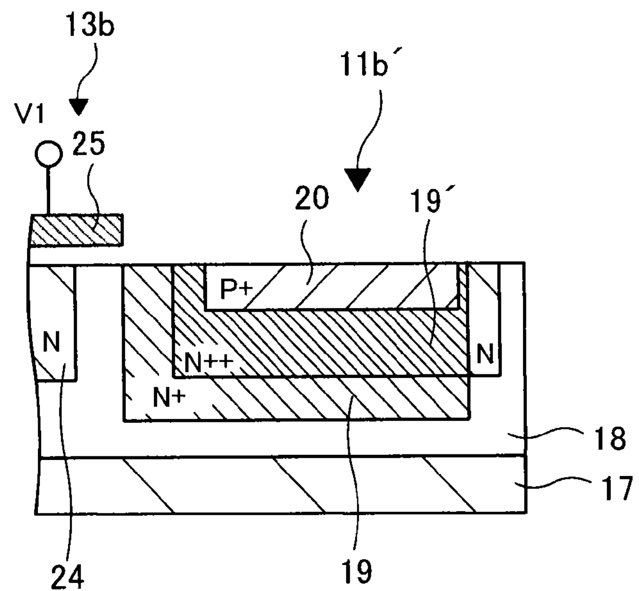
FIG. 3 is a cross-sectional view illustrating a modification example of a second pixel portion.

As illustrated in FIG. 3 illustrating a modification example of the second pixel portion, a second light receiving layer 19' which is an N++ type impurity layer, for example, may be provide in a portion of the light receiving layer 19 of a second pixel portion 11*b*' so as to be separated from the first transfer gate portion 13*b*.

FIG. 2 will be referenced. In the second charge storage portion 12*b*, a first charge storage layer 21 is formed in a planar form on a surface of the well layer 18. Moreover, a second charge storage layer 22 is formed in a portion of the surface of the first charge storage layer 21. The first charge storage layer 21 is an N+ type impurity layer of a higher concentration than the N+ type light receiving layer 19, for example, and the second charge storage layer is an N++ type impurity layer of a higher concentration than the first charge storage layer 21, for example.

A shield layer 23 that shields at least the second charge storage layer 22 is formed on the surface of the second charge storage layer 22 so as to partially protrude toward the first charge storage layer 21. The shield layer 23 is a P+ type impurity layer, for example. Although the shield layer 23 and the shield layer 20 of the second pixel portion 11*b* described above are preferably formed as illustrated in the drawing, the shield layers are optional.

By decreasing the concentration of the shield layer 23, the electric potential of the second charge storage portion 12*b* may be adjusted.

In such a second charge storage portion 12*b*, the first charge storage layer 21 is formed so as to be in contact with the second transfer gate portion 15*b*, and the second charge storage layer 22 is formed so as to be separated from the second transfer gate portion 15*b*. The second charge storage layer 22 is not an essential impurity layer but is optional.

In the first transfer gate portion 13*b* between the second pixel portion 11*b* and the second charge storage portion 12*b*, a first transfer impurity layer 24 is formed on the surface of the well layer 18. The first transfer impurity layer 24 is formed on the surface of the well layer 18 so as to be separated from the light receiving layer 19 and be in contact with the second charge storage layer 22. The first transfer impurity layer 24 is an N type impurity layer of a lower concentration than the first charge storage layer 21, for example. The first transfer impurity layer 24 is an impurity layer for allowing electrical charges to be effectively transferred in the first transfer gate portion 13*b*. Thus, similarly to the second charge storage layer 22, the first transfer impurity layer 24 is not an essential impurity layer but is optional.

The first transfer impurity layer 24 can be formed together with the second charge storage layer by forming the N type impurity layer so as to partially protrude toward the first transfer gate portion 13*b* when the second charge storage layer 22 is formed.

A first transfer electrode 25 is formed on the surface of the well layer 18 including the surface of the first transfer impurity layer 24. The first transfer electrode 25 controls the depth of the electric potential immediately below the first transfer electrode 25 when a predetermined voltage V1 is applied to this electrode 25.

In the offset gate portion 14, an offset gate layer 26 is formed on the surface of the well layer 18. The offset gate layer 26 is an N+ type impurity layer, for example, and is formed over a wide range of regions including the offset gate portion 14 and the charge detecting portion 16.

An offset gate electrode 27 is formed on a portion of the surface of the offset gate layer 26. A predetermined constant voltage V0 (for example, V0=0 V) is applied to the offset gate electrode 27 so that the electric potential of the offset gate portion 14 is fixed to a deeper potential than at least the second charge storage portion 12*b*. By applying a constant voltage in this manner, a variation in the electric potential of the charge detecting portion 16 due to a variation in the electric potential of the second transfer gate portion 15*b* is suppressed, and the accuracy of the charge detecting portion 16 reading a voltage is improved.

Figure 4:
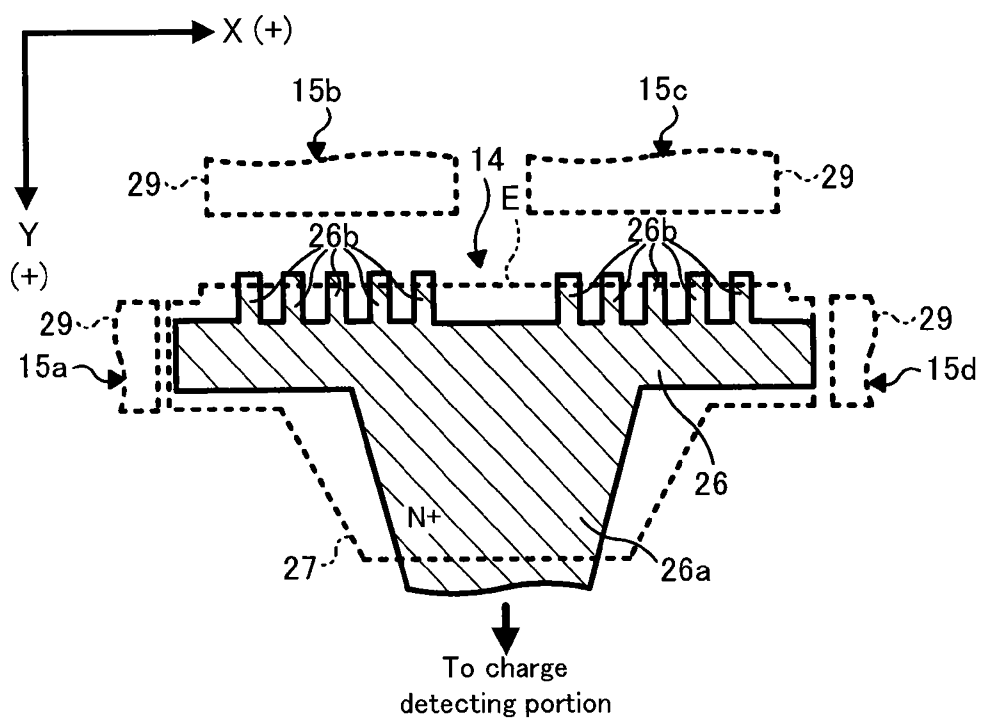
FIG. 4 is a plan view schematically illustrating an offset gate portion of the solid-state imaging device according to the first embodiment and the periphery thereof.

FIG. 4 is a plan view schematically illustrating the offset gate portion 14 and the periphery thereof. In FIG. 4, the offset gate electrode 27 and a second transfer electrode 29 to be described later are depicted by dot lines. Hereinafter, the structure of the offset gate portion 14 will be described in further detail with reference to FIG. 4.

As illustrated in FIG. 4, the offset gate layer 26 has a convex shape and is formed such that a convex portion 26*a* faces the charge detecting portion 16. In this offset gate layer 26, a long side portion (a region adjacent to the second transfer gate portions 15*b* and 15*c*) opposite the convex portion 26*a* has a comb-shape. That is, a plurality of projections 26*b* of the same length are formed on a side of the offset gate layer 26 parallel to the longitudinal direction (X direction) of the pixel portions 11*a*, 11*b*, 11*c*, and 11*d* so as to be separated from each other. The plurality of projections 26*b* are formed in each of the second transfer gate portions 15*b* and 15*c*.

The plurality of projections 26*b* are formed so as to allow electrical charges to be transferred effectively and speedily in the offset gate portion and to suppress deterioration of the transfer characteristics of the electrical charges between the second transfer gate portions 15*b* and 15*c* and the offset gate portion 14, resulting from manufacturing errors. However, the number of projections 26*b*, the distance between the projections 26*b*, and the length and width of the projection 26*b* may be optimized for each product through simulation or the like. The reasons why the above advantages are obtained when the plurality of projections 26*b* are provided in this manner will be described later.

As illustrated in FIGS. 1 and 4, since the width between the long side portion of the offset gate layer 26 and the second transfer gate portion 15 is substantially the same as the length in the longitudinal direction of each of the pixel portions 11*a*, 11*b*, 11*c*, and 11*d* and is large, an electric potential dip or barrier is likely to occur in that region. Thus, the plurality of projections 26*b* are formed in the above-described manner.

In contrast, the width between a short side portion (one side of the offset gate layer 26 perpendicular to the longitudinal direction (X direction) of the pixel portions 11*a*, 11*b*, 11*c*, and 11*d*) of the offset gate layer 26 and the second transfer gate portion 15 is small. Thus, the electric potential in that region becomes shallow due to a narrow channel effect, and electrical charges are transferred smoothly in that region. Therefore, it is not necessary to form the above-described plurality of projections 26*b* in the short side portion of the offset gate layer 26.

In the offset gate portion 14 having such an offset gate layer 26, the offset gate electrode 27 is formed on the surface of the well layer 18, including the offset gate layer 26. The offset gate electrode 27 is formed so that a long side E which is one side of the electrode 27 overlaps the projection 26*b* as illustrated in the drawing, for example.

The formation position of the offset gate electrode 27 is not limited to this position but may be formed on the offset gate layer 26 including the plurality of projections 26*b*. The position of the offset gate electrode 27 in relation to the offset gate layer 26 may be optimized for each product by way of simulation or the like.

FIG. 2 will be referenced again. In the second transfer gate portion 15*b*, the second transfer impurity layer 28 is formed on the surface of the well layer 18. The second transfer impurity layer 28 is formed on the surface of the well layer 18 so as to be separated from the first charge storage layer 21 and the offset gate layer 26. The second transfer impurity layer 28 is an N type impurity layer of the same impurity concentration as the first transfer impurity layer 24, for example. The second transfer impurity layer 28 is an impurity layer for allowing electrical charges to be transferred effectively in the second transfer gate portion 15*b* similarly to the first transfer impurity layer 24. Thus, similarly to the second charge storage layer 22 and the first transfer impurity layer 24, the second transfer impurity layer 28 is not an essential impurity layer but is optional.

The second transfer electrode 29 is formed on the surface of the well layer 18, including the surface of the second transfer impurity layer 28. The second transfer electrode 29 controls the depth of the electric potential immediately below the second transfer electrode 29 when a predetermined voltage V2 is applied to this electrode 29.

In the charge detecting portion 16, a charge detecting layer 30 is formed on the offset gate layer 26 formed on the charge detecting portion 16 (that is, on the surface at a distal end of the convex portion 26*a* of the offset gate layer 26). The charge detecting layer 30 is an N++ type impurity layer of a higher concentration than the offset gate layer 26, for example.

Moreover, a readout electrode 31 for reading the voltage generated in the charge detecting layer 30 as a signal voltage is formed on a portion of the surface of the charge detecting layer 30.

When electrical charges is stored in the charge detecting layer 30, the potential of the charge detecting portion 16 becomes a predetermined voltage corresponding to the amount of stored electrical charges, and this voltage is read by the readout electrode 31 as a signal voltage.

Although the structure of the cross-section of the solid-state imaging device 10 according to the present embodiment has been described, the structure of the cross-section that passes through the third pixel portion 11*c* and the third charge storage portion 12*c* is the same as the structure illustrated in FIG. 2.

Moreover, the structure of the cross-section that passes through the first pixel portions 11*a* and the first charge storage portion 12*a* and the structure of the cross-section that passes through the fourth pixel portion 11*d* and the fourth charge storage portion 12*d* are basically the same as the structure illustrated in FIG. 2, except for the shape of the offset gate layer 26 of the offset gate portion 14.

Figure 5A:
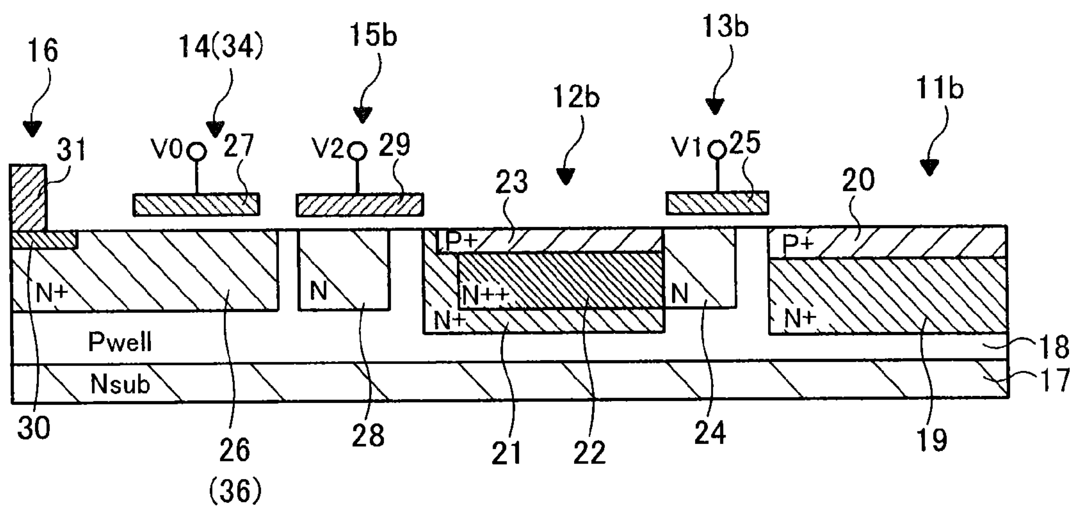
Figure 5B:
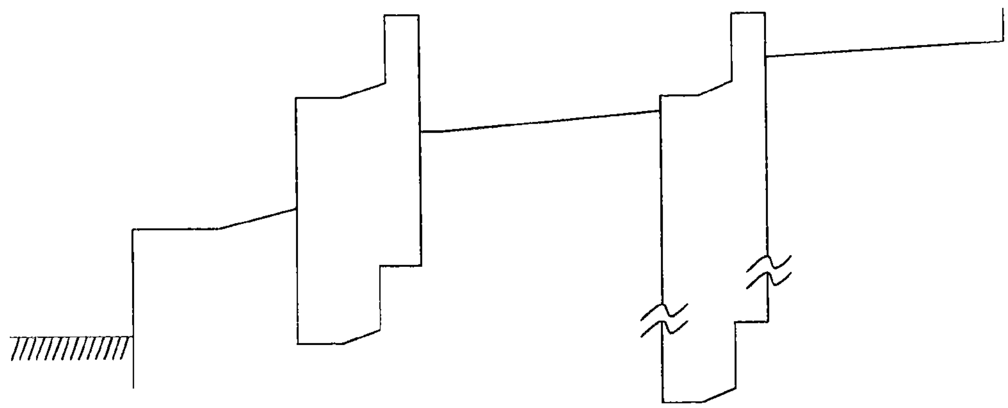

Next, the electric potential in the cross-section illustrated in FIG. 2, of the solid-state imaging device 10 formed in the above-described manner will be described. FIGS. 5A and 5B are diagrams for describing the electric potential formed in the solid-state imaging device 10, in which FIG. 5A is a cross-sectional view of the solid-state imaging device 10 illustrated in FIG. 2, and FIG. 5B is a diagram illustrating the electric potential in the cross-section illustrated in FIG. 5A. In FIG. 5B, the electric potential becomes deeper as it advances downward in the drawing.

As illustrated in FIG. 5A, the light receiving layer 19 is formed in the second pixel portion 11*b*, and the first and second charge storage layers 21 and 22 are formed in the second charge storage portion 12*b*. Moreover, the light receiving layer 19 is separated from the first and second charge storage layers 21 and 22. Thus, as illustrated in FIG. 5B, the electric potential of the second pixel portion 11*b* and the second charge storage portion 12*b* becomes deeper than the electric potential of the first transfer gate portion 13*b* between the second pixel portion 11*b* and the second charge storage portion 12*b*.

By adjusting (decreasing) the concentration of the shield layer 23, it is possible to adjust (increase) the electric potential of the second charge storage portion 12*b*.

In the second charge storage portion 12*b*, the first and second charge storage layers 21 and 22 are formed in a higher concentration than the light receiving layer 19 of the second pixel portion 11*b*. Thus, as illustrated in FIG. 5B, the electric potential of the second charge storage portion 12*b* becomes deeper than the electric potential of the second pixel portion 11*b*.

Further, in the second charge storage portion 12*b*, the second charge storage layer 22 of a higher concentration than the first charge storage layer 21 is formed on the surface of the first charge storage layer 21 so as to be separated from the second transfer gate portion 15*b*.

The first transfer impurity layer 24 is formed in the first transfer gate portion 13*b*. By forming the impurity layer 24, as illustrated in FIG. 5B, the electric potential of the first transfer gate portion 13*b* becomes deep in a step form from the second pixel portion 11*b* toward the second charge storage portion 12*b*. Due to such an electric potential, electrical charges are transferred effectively in the first transfer gate portion 13*b*.

Moreover, as illustrated in FIG. 5A, the first and second charge storage layers 21 and 22 are formed in the second charge storage portion 12*b*, and the offset gate layer 26 is formed in the offset gate portion 14 and the charge detecting portion 16. Moreover, the first charge storage layer 21 and the offset gate layer 26 are separated from each other. Thus, the electric potentials of the second charge storage portion 12*b* and the offset gate portion 14 are deeper than the electric potential of the second transfer gate portion 15*b* between the second charge storage portion 12*b* and the offset gate portion 14.

In the offset gate portion 14, the offset gate electrode 27 is formed on a portion of the surface of the offset gate layer 26. A predetermined constant voltage V0 (for example, V0=0 V) is applied to this electrode 27 so that the electric potential of the offset gate portion 14 is fixed at a position deeper than the second charge storage portion 12*b*. Moreover, as illustrated in FIG. 4B, the concentration of the offset gate layer 26 is adjusted so that the electric potential of the offset gate portion 14 is deeper than the electric potential of the second charge storage portion 12*b*.

The second transfer impurity layer 28 is formed in the second transfer gate portion 15*b*. By forming the impurity layer 28, as illustrated in FIG. 5B, the electric potential of the second transfer gate portion 15*b* becomes deeper in a step form from the second charge storage portion 12*b* toward the offset gate portion 14. Due to such an electric potential, electrical charges are transferred effectively in the second transfer gate portion 15*b*.

Moreover, in the charge detecting portion 16, the charge detecting layer 30 of a higher concentration than the offset gate layer 26 is formed on the surface of the offset gate layer 26. Thus, the electric potential of the charge detecting portion 16 is deeper than the offset gate portion 14. Due to this, the electrical charges transferred to the offset gate portion 14 gathers in the charge detecting portion 16.

Hereinafter, the operation of the solid-state imaging device 10 will be described with reference to FIGS. 5A and 5B.

When light enters the second pixel portion 11*b*, photoelectric conversion occurs so that electrical charges are generated in the light receiving layer 19. The generated electrical charges are stored in the second pixel portion 11*b* due to the barrier formed by the electric potential of the first transfer gate portion 13*b*.

When a predetermined voltage V1 is applied to the first transfer electrode 25 of the first transfer gate portion 13*b* so that the electric potential of the first transfer gate portion 13*b* becomes deeper than the electric potential of the second pixel portion 11*b*, the electrical charges generated in the second pixel portion 11*b* are transferred to the first transfer gate portion 13*b* and arrive in the second charge storage portion 12*b*. The transferred electrical charges are stored in the second charge storage portion 12*b* due to the barrier formed by the electric potential of the second transfer gate portion 15*b*.

When a predetermined voltage V2 is applied to the second transfer electrode 29 of the second transfer gate portion 15*b* so that the electric potential of the second transfer gate portion 15*b* becomes deeper than the electric potential of the second charge storage portion 12*b*, the electrical charges stored in the second charge storage portion 12*b* are transferred to the second transfer gate portion 15*b*, arrive in the offset gate portion 14, and finally, gather in the charge detecting portion 16.

When the electrical charges gather in the charge detecting portion 16, a voltage drop corresponding to the amount of the stored electrical charges occurs in the charge detecting portion 16. The voltage drop is read by the readout electrode 31 as a signal voltage. The solid-state imaging device 10 forms a read signal voltage for forming an image in this manner.

As described above, the electric potential of the second transfer gate portion 15*b* varies in order to transfer electrical charges. Thus, if the charge detecting portion 16 is directly connected to the second transfer gate portion 15*b*, the electric potential of the charge detecting portion 16 also varies with a variation in the electric potential of the second transfer gate portion 15*b*. When the electric potential of the charge detecting portion varies, the signal voltage readout accuracy decreases.

In contrast, as in the present embodiment, the offset gate portion 14 of which the electric potential is fixed is formed between the second transfer gate portion 15*b* and the charge detecting portion 16. Thus, even if the electric potential of the second transfer gate portion 15*b* varies, since the electric potential of the offset gate portion 14 is fixed, a variation of the electric potential of the charge detecting portion 16 is suppressed. As a result, the signal voltage readout accuracy is improved. Due to such a reason, a constant voltage is applied to the offset gate portion 14.

In the solid-state imaging device 10 operating in this manner, a plurality of projections 26*b* are formed on the offset gate layer 26 of the offset gate portion 14. Thus, electrical charges are transferred speedily and effectively in the offset gate portion 14, and deterioration of the transfer characteristics of the electrical charges between the second transfer gate portions 15*b* and 15*c* and the offset gate portion 14, resulting from manufacturing errors is suppressed. The reasons therefor will be described below.

Figure 6:
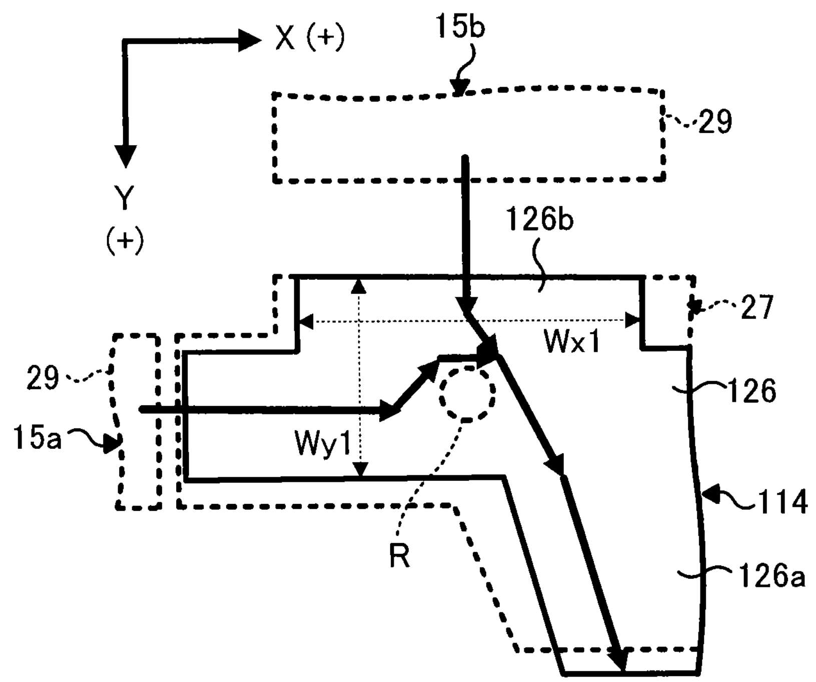
FIG. 6 is a plan view schematically illustrating an offset gate portion of a conventional solid-state imaging device and the periphery thereof.

First, the reason why the electrical charges are transferred speedily and effectively in the offset gate portion 14 when the plurality of projections 26*b* are formed will be described by comparing with the structure of a conventional solid-state imaging device in which such projections 26*b* are not formed. FIG. 6 is a plan view schematically illustrating an offset gate portion of the conventional solid-state imaging device and the periphery thereof. In FIG. 6, the offset gate electrode and the second transfer electrode are depicted by dot lines. Moreover, in FIG. 6, the same structure as the solid-state imaging device according to the present embodiment will be denoted by the same reference numerals as the solid-state imaging device according to the present embodiment.

As illustrated in FIG. 6, an offset gate layer 126 formed in an offset gate portion 114 of the conventional solid-state imaging device also has a convex shape, and a first convex portion 126*a* similar to the convex portion 26*a* of the offset gate layer 26 of the solid-state imaging device 10 according to the present embodiment is formed so as to face the charge detecting portion.

However, in this offset gate layer 126, a second convex portion 126*b* of which the width in the X direction is Wx1 is formed in a long side portion (a portion corresponding to the plurality of projections 26*b* of the offset gate layer 26 of the solid-state imaging device 10 according to the present embodiment) opposite the first convex portion 126*a* so as to correspond to each of the second transfer gate portions. Due to this, the width in the Y direction of the offset gate layer 126 including the second convex portion 126*b* is Wy1.

When the offset gate layer 126 is formed in this manner, since the area of the offset gate layer 126 formed between the second transfer gate portion 15*a* and the second transfer gate portion 15*b* is large, the electric potential of the offset gate portion 114 of this region is deepest in a region indicated by R in the drawing, which is the center of that region. That is, the electric potential of the offset gate portion 114 between the second transfer gate portions 15*a* and 15*b* has a potential dip in the region indicated by R in the drawing.

When such a potential dip is formed, the electrical charges transferred from the second transfer gate portions 15*a* and 15*b* are trapped in the region R of the offset gate portion 114 so that the electrical charges are not transferred to the charge detecting layer. Otherwise, as indicated by an arrow in the drawing, the electrical charge transfer path bends so as to avoid the region R and the transfer speed decreases.

Figure 7:
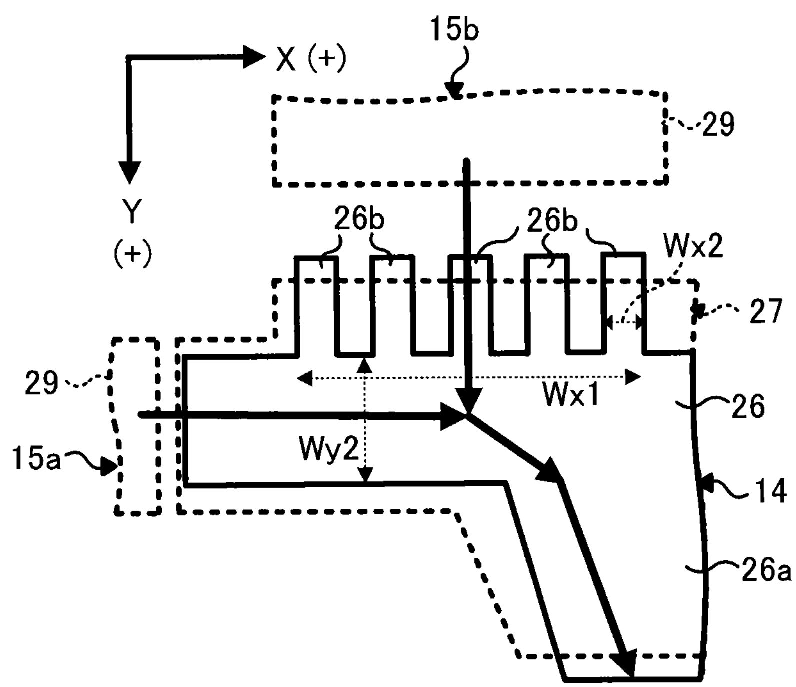
FIG. 7 is a plan view schematically illustrating an offset gate portion of the solid-state imaging device according to the first embodiment and the periphery thereof.

FIG. 7 is a plan view schematically illustrating the offset gate portion 14 of the solid-state imaging device 10 according to the present embodiment and the periphery thereof. In FIG. 7, the offset gate electrode 27 and the second transfer electrode 29 are depicted by dot lines.

As illustrated in FIG. 7, in the offset gate layer 26 of the solid-state imaging device 10 according to the present embodiment, the plurality of projections 26*b* of which the width in the X direction is Wx2 (<Wx1) are formed in a long side portion (that is, at a position corresponding to the second convex portion 126*b* of the conventional offset gate layer 126) opposite the convex portion 26*a* so as to correspond to each of the second transfer gate portions. Due to this, the width in the Y direction of the offset gate layer 26 excluding the plurality of projections 26*b* is Wy2 (<Wy1).

When the offset gate layer 26 is formed in this manner, since the width Wx2 of the plurality of projections 26*b* is narrower than the width Wx1 of the second convex portion 126*b* of the conventional offset gate layer 126, the electric potential of the respective projections 26*b* becomes shallower due to the narrow channel effect. As a result, the electric potential of a region corresponding to the second convex portion 126*b* of the conventional offset gate layer 126, including the plurality of projections 26*b* becomes shallower than the electric potential of the second convex portion 126*b*.

Further, when the plurality of projections 26*b* are formed, the width Wy2 in the Y direction of the offset gate layer 26 formed between the second transfer gate portions 15*a* and 15*b* becomes narrower than the width Wy1 of the conventional offset gate layer 126. Thus, the area of the offset gate layer 26 formed between the second transfer gate portions 15*a* and 15*b* becomes narrower than the conventional offset gate layer 126.

As a result, the formation of a potential dip in the electric potential of the offset gate portion 14 between the second transfer gate portions 15*a* and 15*b* is suppressed.

When the formation of a potential dip is suppressed in this manner, the electrical charges transferred from the second transfer gate portions 15*a* and 15*b* are transferred effectively without being trapped in the offset gate portion 14. Further, since the electrical charges are transferred by a shortest distance as illustrated by the electrical charge transfer path by an arrow in the drawing, the transfer speed is improved.

Next, the reason why the deterioration of the transfer characteristics of the electrical charges, between the second transfer gate portions 15*b* and 15*c* and the offset gate portion 14, resulting from manufacturing errors is suppressed when the plurality of projections 26*b* are formed will be described by comparing with the structure of the conventional solid-state imaging device.

Figure 8A:
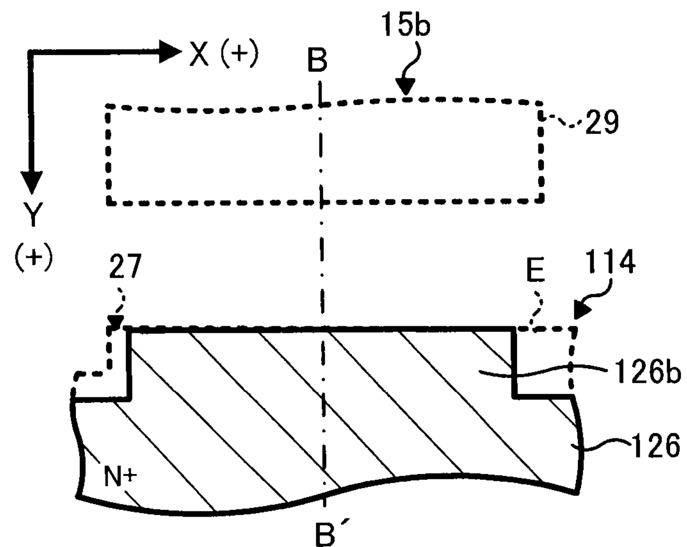
Figure 8B:
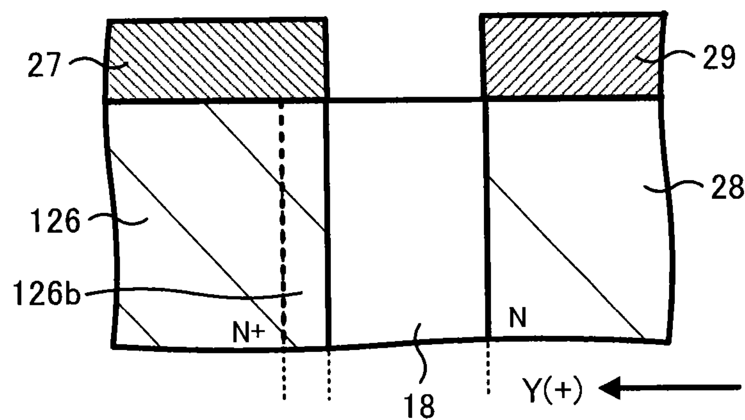
Figure 8C:
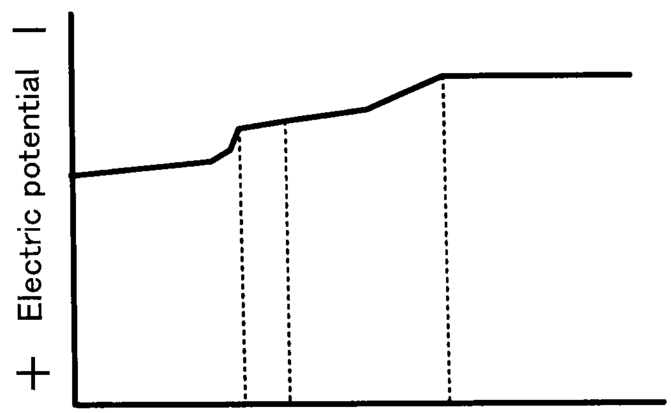
Figure 9A:
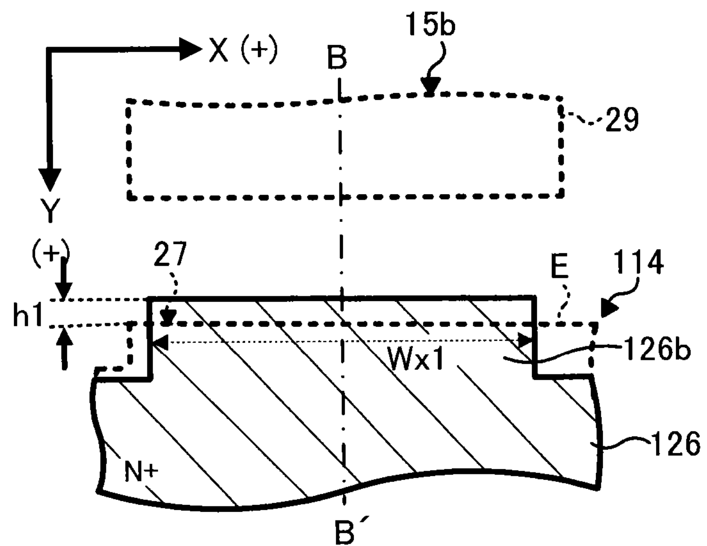
Figure 9B:
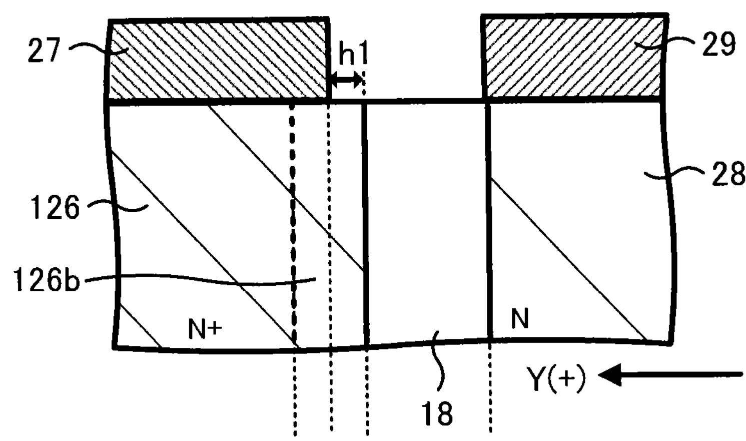
Figure 9C:
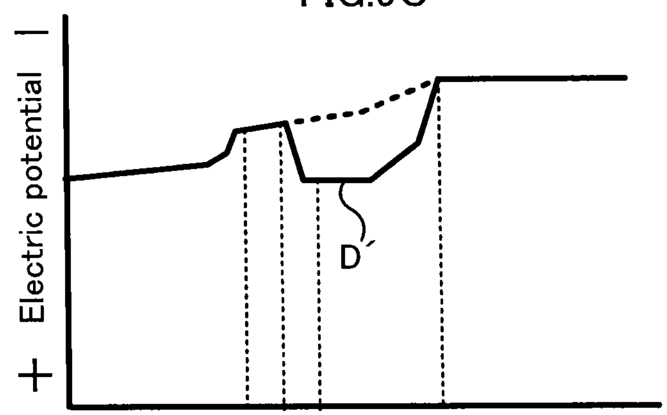
Figure 10A:
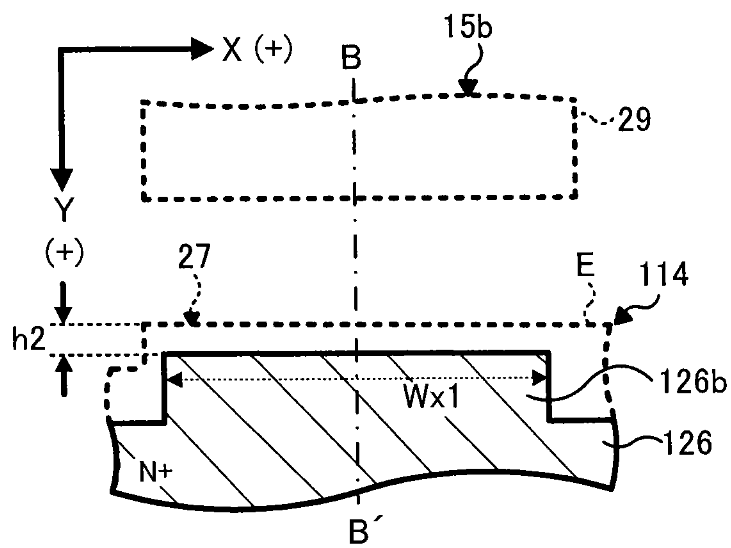
Figure 10B:
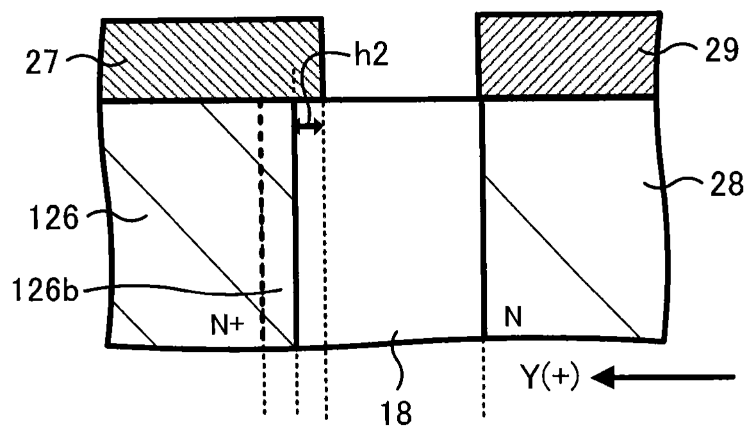
Figure 10C:
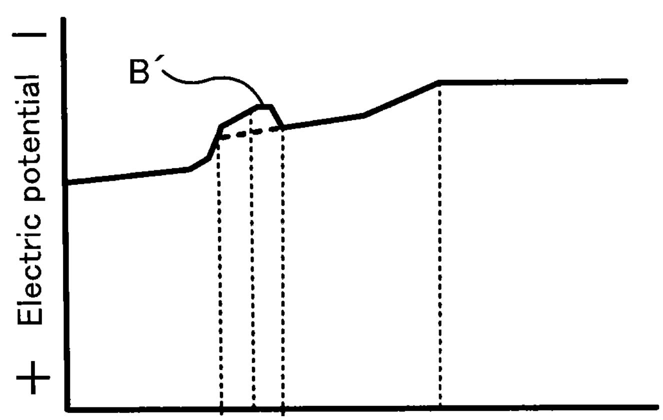

FIGS. 8A to 8C, FIGS. 9A to 9C, and FIGS. 10A to 10C are diagrams for describing a relation between a formation position of the offset gate electrode 27 and electric potentials between the offset gate electrode 27 and the second transfer electrode 29 of the second transfer gate portion 15*b* in the conventional solid-state imaging device. FIGS. 8A, 9A, and 10A are schematic plan views illustrating main components of the offset gate portion 114 at an enlarged scale, FIGS. 8B, 9B, and 10B are cross-sectional views along one-dot chain line B-B' of FIGS. 8A, 9A, and 10A, and FIGS. 8C, 9C, and 10C illustrate an electric potential in the cross-section of FIGS. 8B, 9B, and 10B. In FIGS. 8C, 9C, and 10C, the electric potential becomes deeper as it advances downward in the drawings.

As illustrated in FIGS. 8A and 8B, a case where the offset gate layer 126 and the offset gate electrode 27 are formed such that the position of a distal end of the second convex portion 126*b* of the offset gate layer 126 is identical to the position of the long side E of the offset gate electrode 27 will be taken into consideration. The position of the offset gate layer 126 and the offset gate electrode 27 of this case is referred to as a designed position. Ideally, the offset gate layer 126 and the offset gate electrode 27 are preferably formed at this designed position.

When the layer and electrode are formed at the designed position in this manner, as illustrated in FIG. 8C, the electric potential between the second transfer electrode 29 and the offset gate electrode (hereinafter, this region will be referred to as an inter-gate gap) is inclined so as to become deeper as it advances from the second transfer gate portion 15*b* where the electric potential is shallow toward the offset gate portion 14 where the electric potential is deep (that is, in the electrical charge transfer direction (Y(+) direction)). Therefore, electrical charges are transferred effectively in this inter-gate gap.

However, as illustrated in FIGS. 9A and 9B, when the offset gate layer 126 is formed at a position shifted by h1, for example, in the direction (the Y(−) direction, that is, the direction opposite to the Y(+) direction in the drawing) closer to the second transfer electrode 29 in relation to the position of the offset gate electrode 27 due to manufacturing errors, the offset gate layer 126 enters into the inter-gate gap.

When the offset gate layer 126 is formed in this manner, the area of the offset gate layer 126 in the inter-gate gap increases by Sn' (=Wx1×□h1) as compared to the case illustrated in FIGS. 8A and 8B. Thus, the electric potential in the inter-gate gap becomes deeper than the electric potential (the electric potential depicted by dot lines in FIG. 9C) illustrated in FIG. 8C and a potential dip D' is formed as illustrated in FIG. 9C. This potential dip D' traps the electrical charges that are to be transferred. Thus, when the potential dip D' is formed in this manner, the transfer characteristics of the electrical charges in the inter-gate gap deteriorate.

Moreover, as illustrated in FIGS. 10A and 10B, when the offset gate layer 126 is formed at a position shifted by h2, for example, in a direction (the Y(+) direction in the drawing) away from the second transfer electrode 29 in relation to the position of the offset gate electrode 27 due to manufacturing errors, the well layer 18 enters immediately below the offset gate electrode 27.

When the offset gate layer 126 is formed in this manner, the area of the well layer 18 immediately below the offset gate electrode 27 increases by Sp' (=Wx1×h2) as compared to the case illustrated in FIGS. 8A and 8B. Thus, the electric potential immediately below the offset gate electrode 27 becomes shallower than the electric potential (the electric potential depicted by dot lines in FIG. 10C) illustrated in FIG. 8C, and a potential barrier B' is formed as illustrated in FIG. 10C. This potential barrier B' inhibits the transfer of electrical charges in the Y direction. Thus, when the potential barrier B' is formed in this manner, the transfer characteristics of the electrical charges in the inter-gate gap deteriorate.

As described above, in the conventional solid-state imaging device, when the relative position of the offset gate layer 126 to the offset gate electrode 27 is shifted from an ideal position due to manufacturing errors, the potential dip D' or the potential barrier B' is formed in the electric potential, which deteriorates the transfer characteristics of the electrical charges between the second transfer gate portion 15*b* (15*c*) and the offset gate portion 114.

Figure 11A:
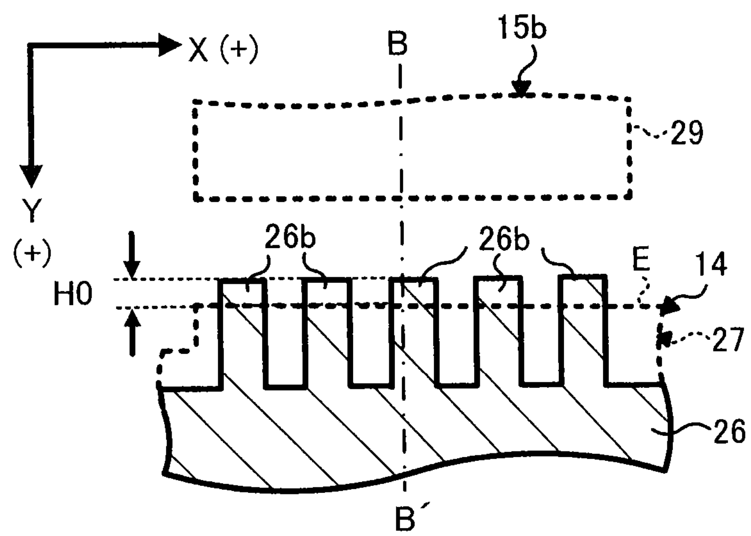
Figure 11B:
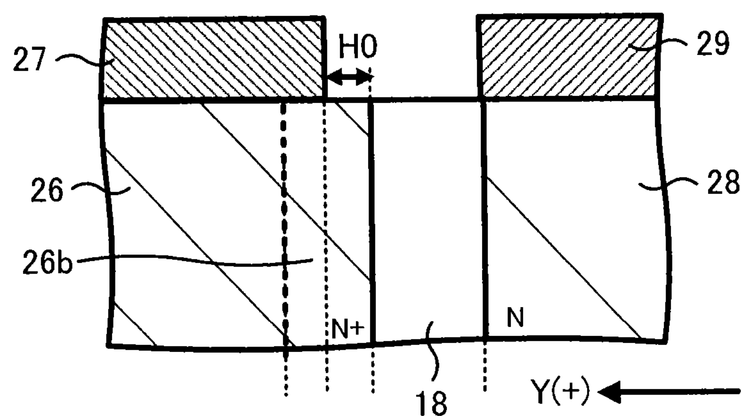
Figure 11C:
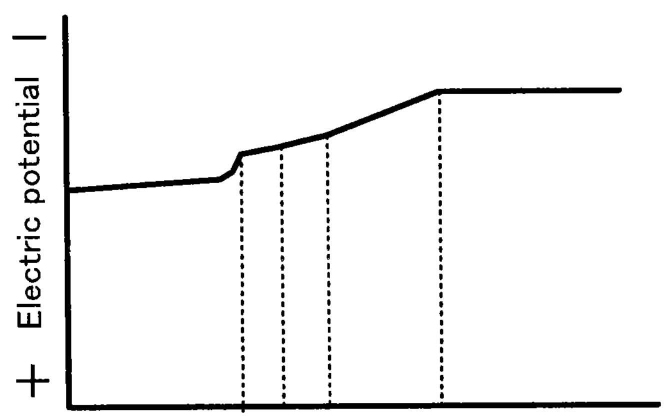
Figure 12A:
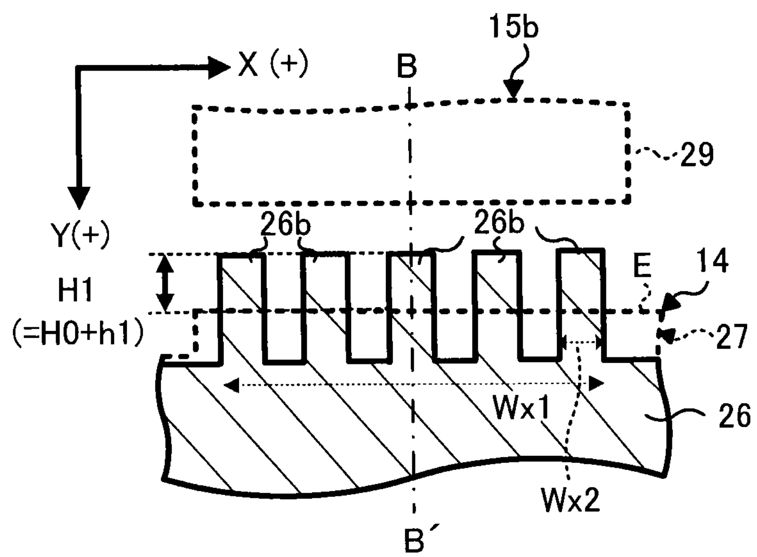
Figure 12B:
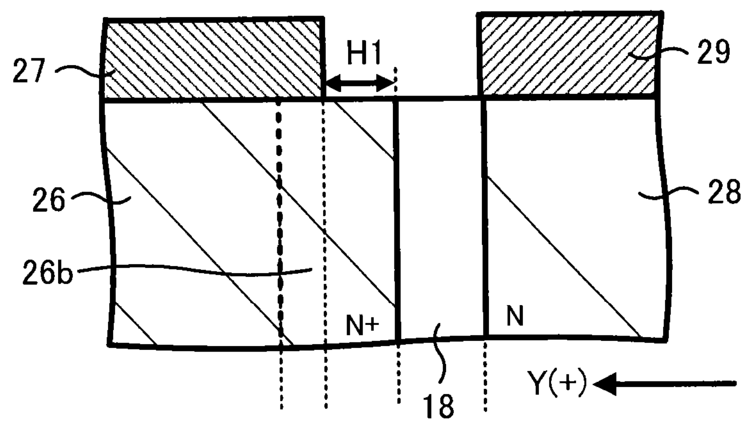
Figure 12C:
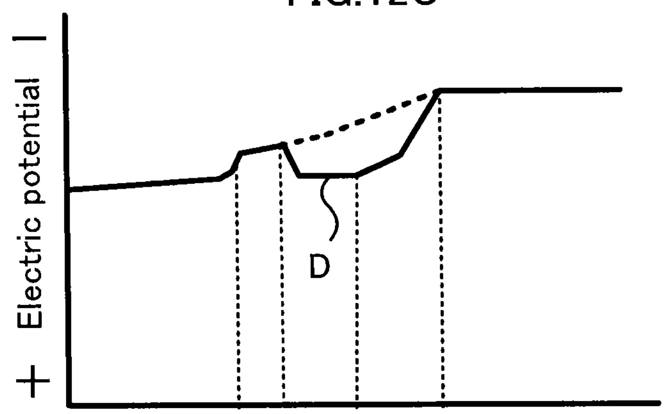
Figure 13A:
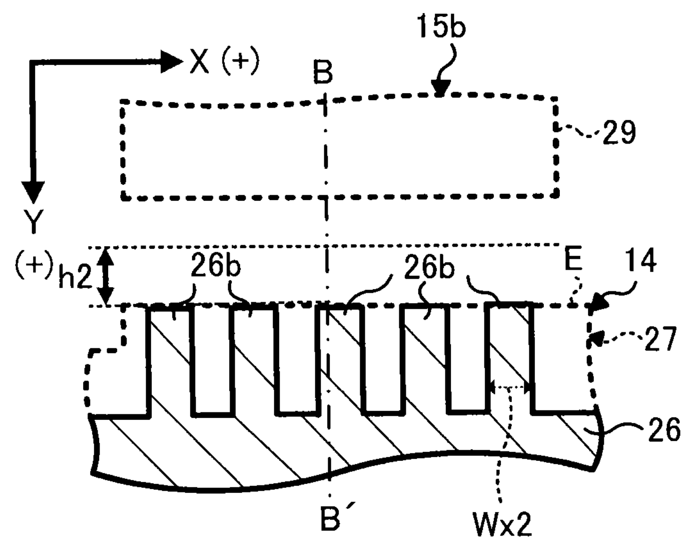
Figure 13B:
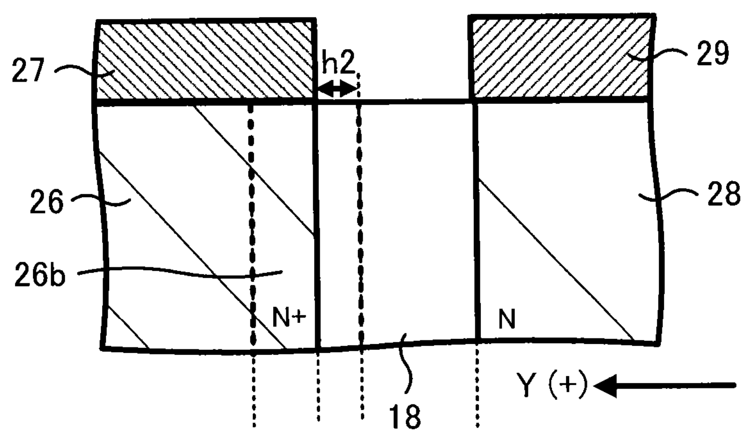

FIGS. 11A to 11C, FIGS. 12A to 12C, and FIGS. 13A to 13C are diagrams for describing a relation between a formation position of the offset gate electrode 27 and electric potentials between the offset gate electrode 27 and the second transfer electrode 29 of the second transfer gate portion 15*b* in the solid-state imaging device 10 according to the present embodiment. FIGS. 11A, 12A, and 13A are schematic plan views illustrating main components of the offset gate portion 14 at an enlarged scale, FIGS. 11B, 12B, and 13B are cross-sectional views along one-dot chain line B-B' of FIGS. 11A, 12A, and 13A, and FIGS. 11C, 12C, and 13C illustrate an electric potential in the cross-section of FIGS. 11B, 12B, and 13B. In FIGS. 8C, 9C, and 10C, the electric potential becomes deeper as it advances downward in the drawings.

As illustrated in FIGS. 11A and 11B, a case where the offset gate layer 26 and the offset gate electrode 27 are formed such that the position of a distal end of the projection 26*b* of the offset gate layer 26 is shifted by H0 in the Y(−) direction from the position of the long side E of the offset gate electrode 27 will be taken into consideration. The position of the offset gate layer 26 and the offset gate electrode 27 of this case is referred to as a designed position. Ideally, the offset gate layer 26 and the offset gate electrode 27 are preferably formed at this designed position.

When the layer and electrode are formed at the designed position in this manner, as illustrated in FIG. 11C, the electric potential of the inter-gate gap is inclined so as to become deeper as it advances from the second transfer gate portion 15*b* where the electric potential is shallow toward the offset gate portion 14 where the electric potential is deep (that is, in the electrical charge transfer direction (Y(+) direction)). Therefore, electrical charges are transferred effectively in this inter-gate gap.

However, as illustrated in FIGS. 12A and 12B, when the offset gate layer 26 is formed at a position shifted by h1, for example, in the Y(−) direction in relation to the position of the offset gate electrode 27 due to manufacturing errors, the offset gate layer 26 is formed such that the distal end of the projection 26*b* is disposed so as to be shifted by H1 (=H0+h1) in the Y(−) direction from the position of the long side E of the offset gate electrode 27. That is, the projection 26*b* of the offset gate layer 26 further enters into the inter-gate gap.

When the offset gate layer 26 is formed in this manner, the area of the offset gate layer 26 in the inter-gate gap increases by Sn1 (=(Wx2×5)×h1) as compared to the case illustrated in FIGS. 11A and 11B. Thus, the electric potential in the inter-gate gap becomes deeper than the electric potential (the electric potential depicted by dot lines in FIG. 12C) illustrated in FIG. 11C and a potential dip D is formed as illustrated in FIG. 12C.

However, the amount of increase Sn1 in the area of the offset gate layer 26 in the inter-gate gap is smaller than the amount of increase Sn' in the area of the offset gate layer 126 when the same amount of positional shift occurs in the conventional solid-state imaging device. Thus, the depth of the potential dip D formed in the solid-state imaging device according to the present embodiment is lower than the depth of the potential dip D' formed in the conventional solid-state imaging device. Therefore, deterioration of the transfer characteristics of the electrical charges in an inter-gate gap is suppressed as compared to the conventional solid-state imaging device.

Moreover, as illustrated in FIGS. 13A and 13B, when the offset gate layer 26 is formed at a position shifted by h2, for example, in the Y(+) direction in relation to the position of the offset gate electrode 27 due to manufacturing errors, the offset gate layer 26 is formed such that the position of the distal end of the projection 26*b* is identical to the position of the long side E of the offset gate electrode 27. That is, the well layer 18 further enters immediately below the offset gate electrode 27.

Figure 13C:
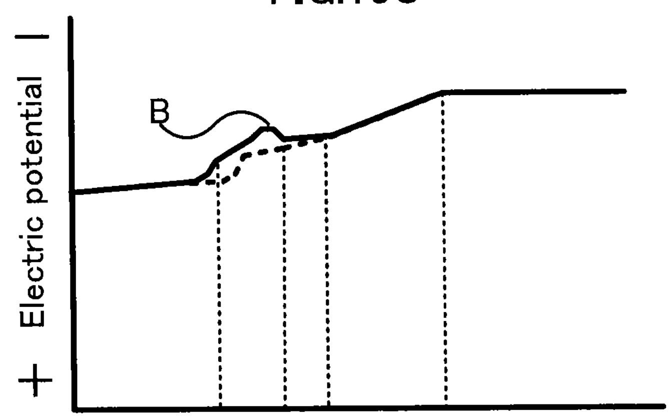

When the offset gate layer 26 is formed in this manner, the area of the well layer 18 immediately below the offset gate electrode 27 increases by Sp1 (=(Wx2×5)×h2) as compared to the case illustrated in FIGS. 11A and 11B. Thus, the electric potential immediately below the offset gate electrode 27 becomes shallower than the electric potential (the electric potential depicted by dot lines in FIG. 13C) illustrated in FIG. 11C, and a potential barrier B is formed as illustrated in FIG. 13C.

However, the amount of increase Sp1 in the area of the well layer 18 immediately below the offset gate electrode 27 is smaller than the amount of increase Sp' in the area of the well layer 18 when the same amount of positional shift occurs in the conventional solid-state imaging device. Thus, the height of the potential barrier B formed in the solid-state imaging device according to the present embodiment is lower than the height of the potential barrier B' formed in the conventional solid-state imaging device. Therefore, deterioration of the transfer characteristics of the electrical charges in an inter-gate gap is suppressed as compared to the conventional solid-state imaging device.

When a plurality of projections 26*b* of the same length are formed in this manner, impurities injected when forming the offset gate layer 26 are diffused in the horizontal direction (the direction extending in the Y direction) due to thermal diffusion. Thus, even when the offset gate layer 26 is formed so that the plurality of projections 26*b* are formed, the plurality of projections 26*b* may eventually be connected to each other so as to have a shape close to that of the second convex portion 126*b* of the offset gate layer 126 of the conventional solid-state imaging device. In this case, the amount of increase in the area of the offset gate layer 26 in the inter-gate gap and the amount of increase in the area of the well layer 18 immediately below the offset gate electrode 27 are substantially the same as those of the conventional solid-state imaging device. However, the amount of increase in the amount of impurities in the inter-gate gap and immediately below the offset gate electrode 27 is suppressed. Thus, even when the plurality of projections 26*b* are connected to each other due to thermal diffusion, the depth of the potential dip and the height of the potential barrier are suppressed as compared to the conventional solid-state imaging device and the deterioration of the transfer characteristics of the electrical charges in the inter-gate gap is suppressed.

Figure 14:
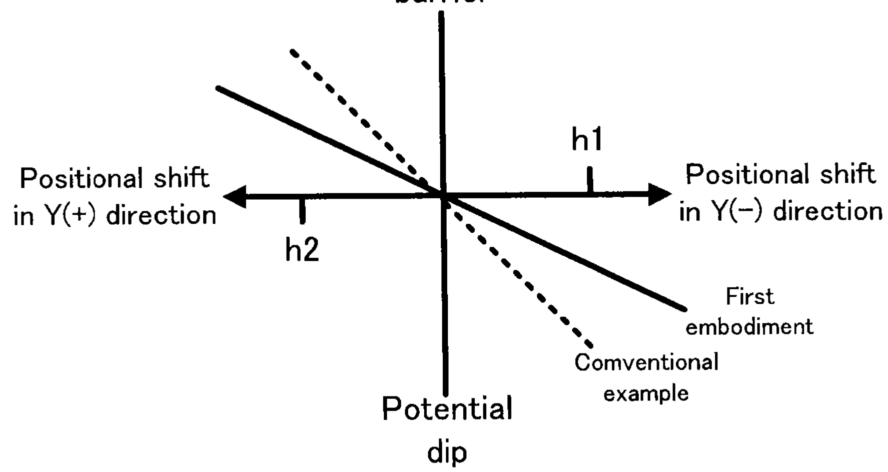
FIG. 14 is a diagram illustrating a relation between a relative positional shift amount between an offset gate layer and an offset gate electrode and a variation amount of electric potential in relation to the positional shift amount in the conventional solid-state imaging device and the solid-state imaging device according to the first embodiment.

FIG. 14 is a diagram illustrating a relation between a relative positional shift amount between an offset gate layer and an offset gate electrode and a variation amount of an electric potential in relation to the positional shift amount in the conventional solid-state imaging device and the solid-state imaging device 10 according to the present embodiment. In the drawing, the horizontal axis represents a positional shift amount in the Y(+) direction and Y(−) direction, and the vertical axis represents a variation amount of the electric potential.

As illustrated in FIG. 14, in the conventional solid-state imaging device, as indicated by dot lines, the larger the relative positional shift amount between the offset gate layer 126 and the offset gate electrode 27 is, the more the variation amount of the electric potential abruptly increases. That is, the closer the position of the offset gate layer 126 approaches in the Y(−) direction in relation to the position of the offset gate electrode 27, the more the depth of the potential dip abruptly increases. Moreover, the closer the position of the offset gate layer 126 approaches in the Y(+) direction in relation to the position of the offset gate electrode 27, the more the height of the potential barrier abruptly increases.

In contrast, in the solid-state imaging device 10 according to the present embodiment, as indicated by a solid line, the larger the relative positional shift amount between the offset gate layer 26 and the offset gate electrode 27 is, the larger the variation amount of the electric potential becomes, whereas the smaller the variation amount of the electric potential in relation to the positional shift amount becomes, as compared to the conventional solid-state imaging device. Due to this, deterioration of the transfer characteristics of the electrical charges, between the second transfer gate portion 15*b* (15*c*) and the offset gate portion 14, resulting from manufacturing errors is suppressed.

As described above, according to the solid-state imaging device 10 according to the present embodiment, the plurality of projections 26*b* are formed on the offset gate layer 26 so as to correspond to each of the second transfer gate portions 15*b* and 15*c*. Therefore, the electrical charges can be transferred speedily and effectively in the offset gate portion 14. Further, it is possible to suppress deterioration of the transfer characteristics of the electrical charges between the second transfer gate portions 15*b* and 15*c* and the offset gate portion 14, resulting from manufacturing errors and to improve the yield.

Second Embodiment

Next, a solid-state imaging device according to a second embodiment will be described. An overall structure of the solid-state imaging device according to the second embodiment is the same as the structure illustrated in FIGS. 1 and 2, and the operation thereof is the same as the operation described with reference to FIGS. 5A and 5B. Thus, description thereof will not be provided, and features different from a first solid-state imaging device 10 will be described.

Figure 15:
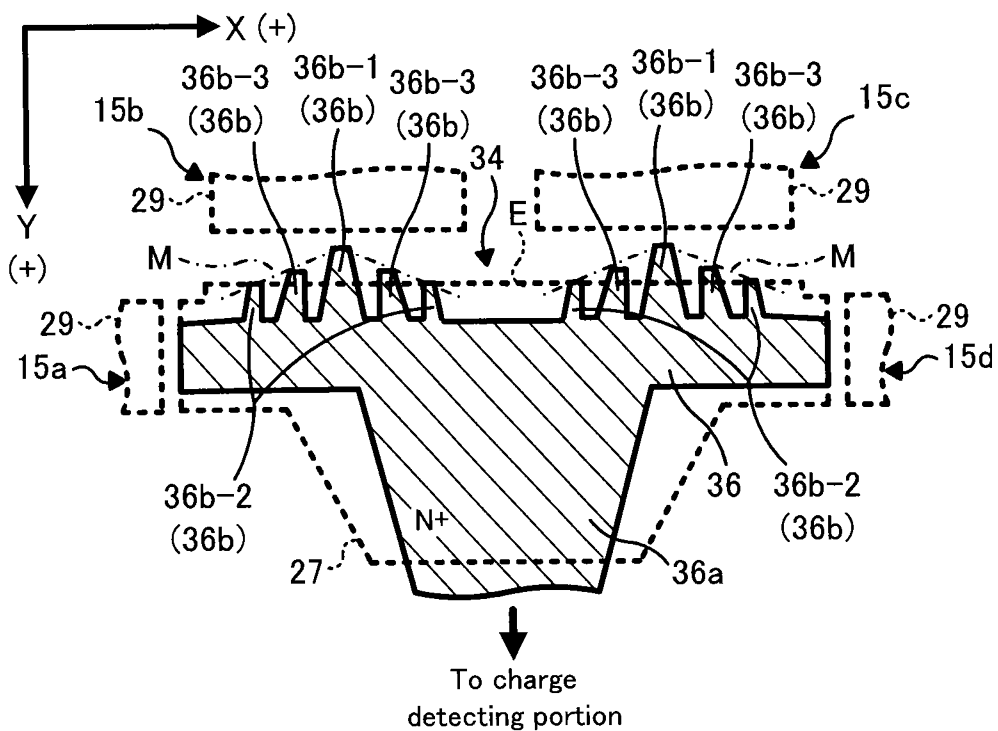
FIG. 15 is a plan view schematically illustrating an offset gate portion of a solid-state imaging device according to a second embodiment and the periphery thereof.

FIG. 15 is a plan view schematically illustrating an offset gate portion of a solid-state imaging device according to the second embodiment and the periphery thereof. As illustrated in FIG. 15, in the solid-state imaging device according to the second embodiment, the structure of an offset gate layer 36 of an offset gate portion 34 is different from that of the solid-state imaging device 10 according to the first embodiment.

As illustrated in FIG. 15, the offset gate layer 36 has a convex shape and is formed such that a convex portion 36*a* faces a charge detecting portion 16. In this offset gate layer 36, a long side portion (a region adjacent to the second transfer gate portions 15*b* and 15*c*) opposite the convex portion 36*a* has a comb-shape. That is, a plurality of projections 36*b* are formed on a long side portion of the offset gate layer 36 so as to be separated from each other. The plurality of projections 36*b* are formed in each of the second transfer gate portions 15*b* and 15*c*. The shapes thereof are the same as those of the solid-state imaging device 10 according to the first embodiment.

However, in the solid-state imaging device according to the present embodiment, the plurality of projections 36*b* have a different shape. That is, in the present embodiment, the lengths of the projections 36*b* are different.

The plurality of projections 36*b* in each of the second transfer gate portions 15*b* and 15*c* include a central projection 36*b*-1, end projections 26*b*-2, and intermediate projections 26*b*-3 between the central projection and the end projections, and these projections have different lengths. The central projection 36*b*-1 is longest, the end projections 36*b*-2 are shortest, and the length of the intermediate projections 36*b*-3 is between those of the central projection 36*b*-1 and the end projections 36*b*-2. Thus, the plurality of projections 36*b* are formed so that a line M connecting the distal ends of the plurality of projections 36*b* forms a mountain shape of which the apex is the distal end of the central projection 36*b*-1.

In the offset gate portion 34 having such an offset gate layer 36, an offset gate electrode 27 is formed on a surface of the well layer 18, including the offset gate layer 36.

In such an offset gate portion 34, when the plurality of projections 36*b* are formed in the above-described manner, deterioration of the transfer characteristics of the electrical charges between the second transfer gate portion 15*b* (15*c*) and the offset gate portion 34 is suppressed more. The reasons therefor will be described below.

Figure 16A:
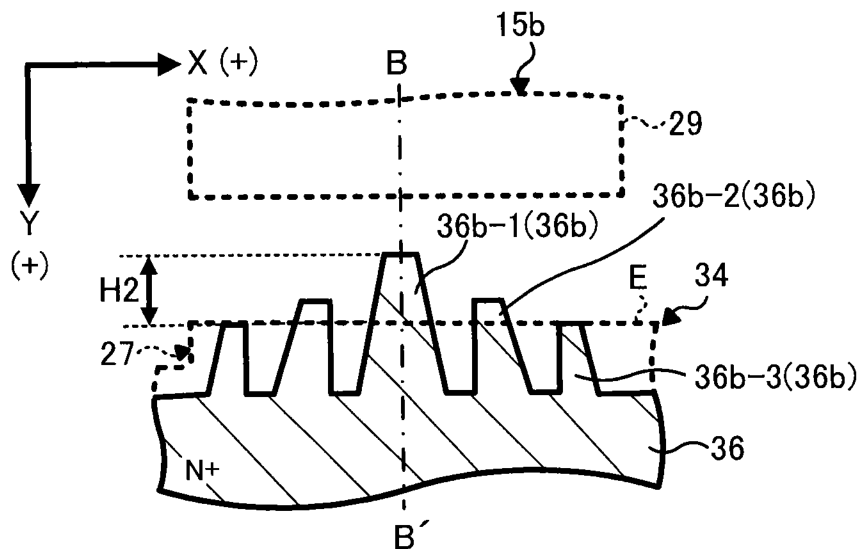
Figure 16B:
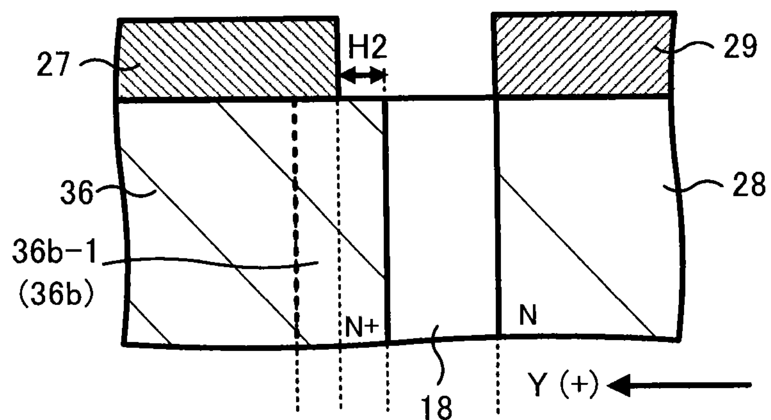
Figure 16C:
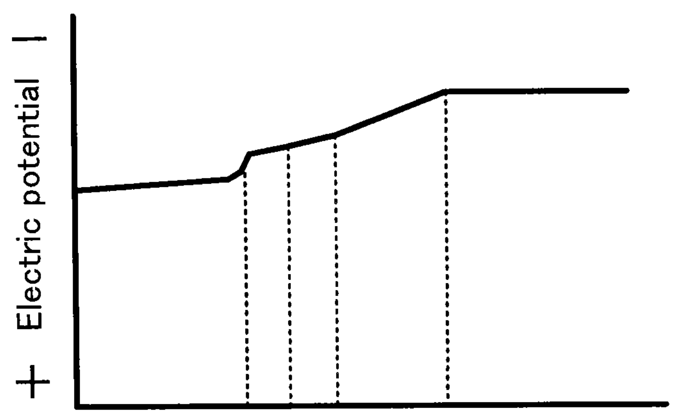
Figure 17A:
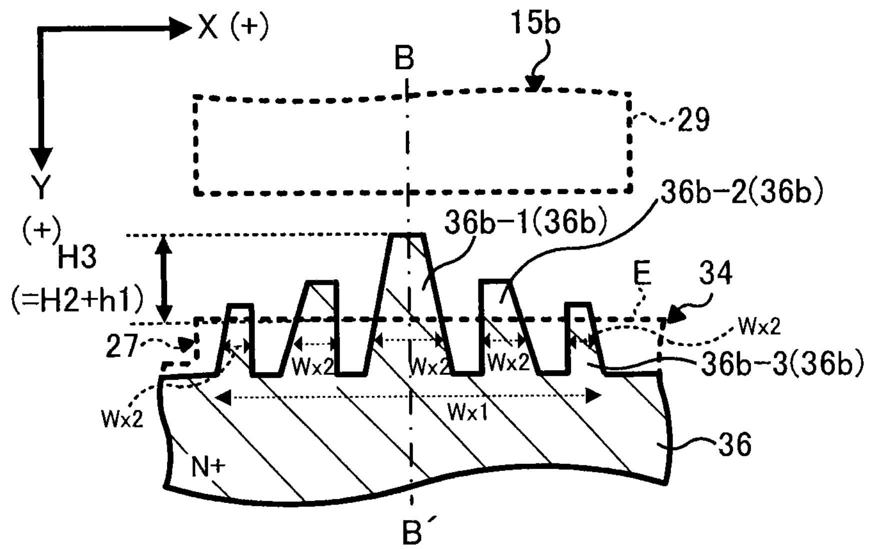
Figure 17B:
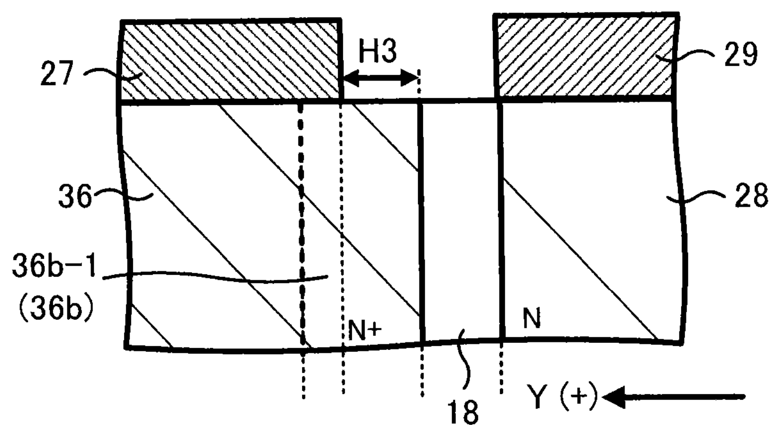
Figure 17C:
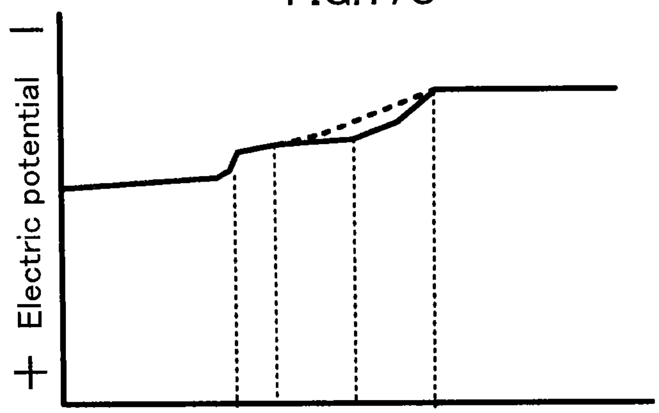
Figure 18A:
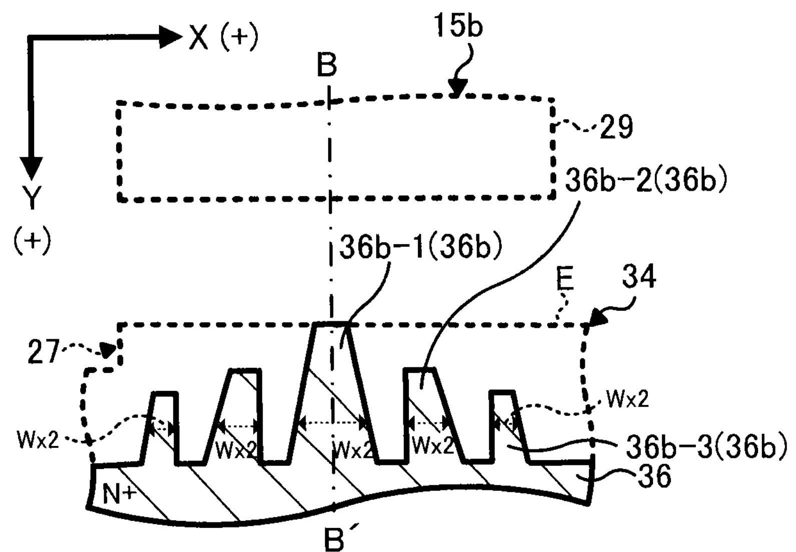
Figure 18B:
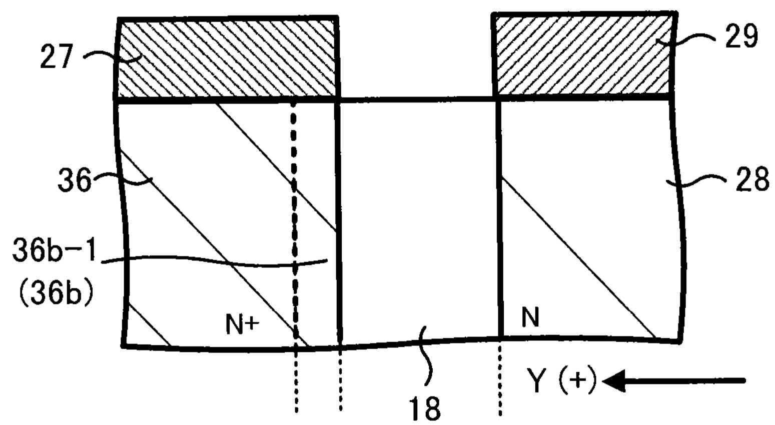

FIGS. 16A to 16C, FIGS. 17A to 17C, and FIGS. 18A to 18C are diagrams for describing a relation between a formation position of the offset gate electrode 27 and electric potentials between the offset gate electrode 27 and the second transfer electrode 29 of the second transfer gate portion 15*b* in the solid-state imaging device according to the second embodiment. FIGS. 16A, 17A, and 18A are schematic plan views illustrating main components of the offset gate portion 34 at an enlarged scale, FIGS. 16B, 17B, and 18B are cross-sectional views along one-dot chain line B-B' of FIGS. 16A, 17A, and 18A, and FIGS. 16C, 17C, and 18C illustrate electric potential in the cross-section of FIGS. 16B, 17B, and 18B. In FIGS. 8C, 9C, and 10C, the electric potential becomes deeper as it advances downward in the drawings.

As illustrated in FIGS. 16A and 16B, a case where the offset gate layer 36 and the offset gate electrode 27 are formed such that the position of a distal end of the central projection 36*b*-1 is shifted by H2 in the Y(−) direction from the position of the long side E of the offset gate electrode 27 and the position of the distal end of the end projection 36*b*-2 overlaps the position of the long side E of the offset gate electrode 27 will be taken into consideration. The position of the offset gate layer 36 and the offset gate electrode 27 of this case is referred to as a designed position. Ideally, the offset gate layer 36 and the offset gate electrode 27 are preferably formed at this designed position.

When the layer and electrode are formed at the designed position in this manner, as illustrated in FIG. 16C, the electric potential of the inter-gate gap is inclined so as to become deeper as it advances from the second transfer gate portion 15*b* where the electric potential is shallow toward the offset gate portion 34 where the electric potential is deep, that is, in the electrical charge transfer direction (Y(+) direction). Therefore, electrical charges are transferred effectively in this inter-gate gap.

However, as illustrated in FIGS. 17A and 17B, when the offset gate layer 36 is formed at a position shifted by h1, for example, in the Y(−) direction in relation to the position of the offset gate electrode 27 due to manufacturing errors, the offset gate layer 36 is formed such that the distal end of the central projection 36*b*-1 is shifted by H3 (=H2+h1) in the Y(−) direction from the position of the long side E of the offset gate electrode 27 and the distal end of the end projection 36*b*-2 is shifted by h1 in the Y(−) direction from the position of the long side E of the offset gate electrode 27. That is, all projections 36*b* of the offset gate layer 36 enter into the inter-gate gap.

When the offset gate layer 36 is formed in this manner, the area of the offset gate layer 36 in the inter-gate gap increases by Sn2 (=(Wx2×5)×h1) (=Sn1) as compared to the case illustrated in FIGS. 16A and 16B. Thus, the electric potential in the inter-gate gap becomes deeper than the electric potential (the electric potential depicted by dot lines in FIG. 17C) illustrated in FIG. 16C.

Here, in the solid-state imaging device 10 according to the first embodiment, since all projections 26*b* have the same length, the projections 26*b* are connected to each other due to thermal diffusion of impurities that form these projections 26*b*. In this case, the narrow channel effect of the plurality of projections 26*b* weakens so that the effect of making the electric potential shallow is not much obtained. Thus, as illustrated in FIGS. 12A to 12C, a potential dip D shallower than the conventional potential dip D' is formed.

In contrast, according to the solid-state imaging device according to the present embodiment, since the projections 36*b* have different lengths, the projections 36*b* are suppressed from being connected to each other even when impurities that form the projections 36*b* are thermally diffused. Thus, the narrow channel effect of the plurality of projections 36*b* becomes stronger as compared to the solid-state imaging device 10 according to the first embodiment, and the effect of making the electric potential in the entire region including the plurality of projections 36*b* shallow becomes stronger as compared to the solid-state imaging device 10 according to the first embodiment. As a result, as illustrated in FIG. 17C, it is possible to further suppress the formation of a potential dip in the inter-gate gap and to further suppress deterioration of the transfer characteristics of the electric potential in the inter-gate gap as compared to the solid-state imaging device 10 according to the first embodiment.

Moreover, as illustrated in FIGS. 18A and 18B, when the offset gate layer 36 is formed at a position shifted by h2, for example, in the Y(+) direction in relation to the position of the offset gate electrode 27 due to manufacturing errors, the offset gate layer 36 is formed such that the position of the distal end of the central projection 36*b* is identical to the position of the long side E of the offset gate electrode 27. That is, the well layer 18 enters immediately below the offset gate electrode 27.

When the offset gate layer 36 is formed in this manner, the area of the well layer 18 immediately below the offset gate electrode 27 increases by Sp2 (=(Wx2×4)×h2) as compared to the case illustrated in FIGS. 16A and 16B. Thus, the electric potential immediately below the offset gate electrode 27 becomes shallower than the electric potential (the electric potential depicted by dot lines in FIG. 18C) illustrated in FIG. 16C.

Figure 18C:
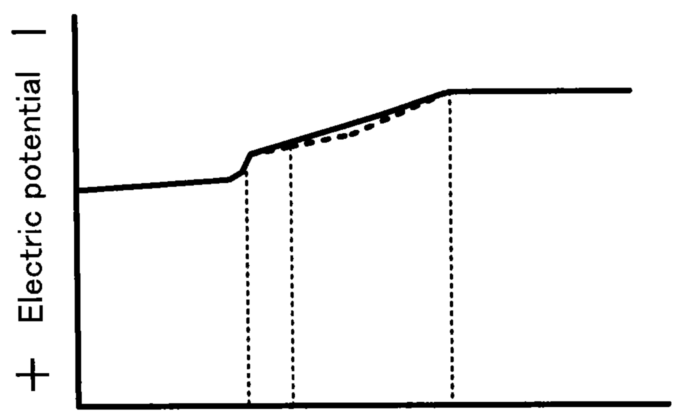

When the plurality of projections 36*b* are formed in this manner, the amount of increase Sp2 in the area of the well layer 18 immediately below the offset gate electrode 27 can be decreased from the amount of increase Sp1 (=(Wx2×5)×h2) in the area of the solid-state imaging device 10 according to the first embodiment. In other words, the amount of increase in the amount of impurities immediately below the offset gate electrode 27 is smaller than the amount of increase in the amount of impurities of the first solid-state imaging device 10. Thus, as illustrated in FIG. 18C, it is possible to further suppress the formation of a potential barrier immediately below the offset gate electrode 27 and to further suppress deterioration of the transfer characteristics of the electrical charges in the inter-gate gap as compared to the solid-state imaging device 10 according to the first embodiment.

Figure 19:
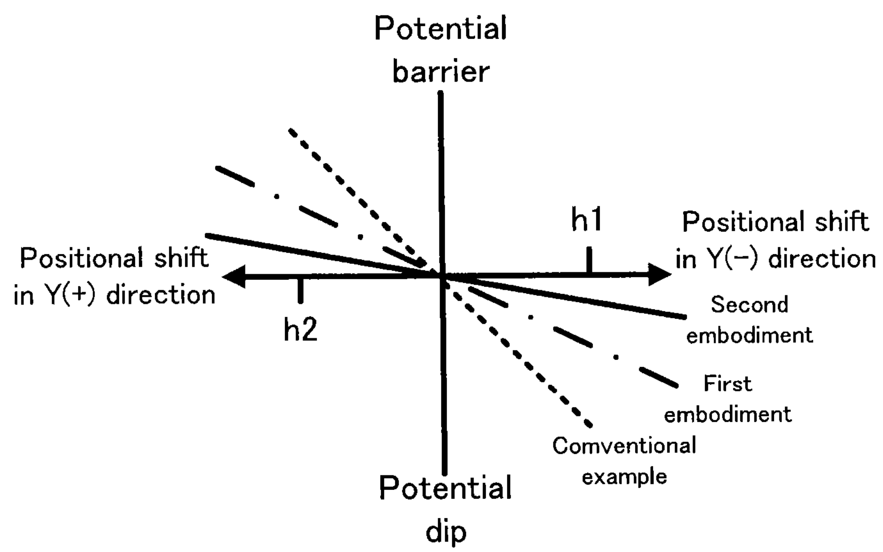
FIG. 19 is a diagram illustrating a relation between a relative positional shift amount between an offset gate layer and an offset gate electrode and a variation amount of electric potential in relation to the positional shift amount in the conventional solid-state imaging device and the solid-state imaging devices according to the first and second embodiments.

FIG. 19 is a diagram illustrating a relation between a relative positional shift amount between an offset gate layer and an offset gate electrode and a variation amount of electric potential in relation to the positional shift amount in the conventional solid-state imaging device and the solid-state imaging devices according to the first and second embodiments. In the drawing, the horizontal axis represents a positional shift amount in the Y(+) direction and Y(−) direction, and the vertical axis represents a variation amount of the electric potential.

As illustrated in FIG. 19, in the solid-state imaging device according to the second embodiment, similarly to the solid-state imaging device according to the first embodiment, the larger the relative positional shift amount between the offset gate layer 36 and the offset gate electrode 27, the larger the variation amount of the electric potential. However, as indicated by a solid line, the variation amount of the electric potential in relation to the positional shift amount is smaller as compared to the solid-state imaging device 10 according to the first embodiment. Due to this, deterioration of the transfer characteristics of the electrical charges between the second transfer gate portion 15*b* (15*c*) and the offset gate portion 14, resulting from manufacturing errors is suppressed more.

In the solid-state imaging device according to the second embodiment described hereinabove, similarly to the solid-state imaging device 10 according to the first embodiment, the plurality of projections 36*b* are formed on the offset gate layer 36 so as to correspond to each of the second transfer gate portions 12*b* and 12*c*. Therefore, the electrical charges can be transferred speedily and effectively in the offset gate portion 14. Further, it is possible to suppress deterioration of the transfer characteristics of the electrical charges between the second transfer gate portions 15*b* and 15*c* and the offset gate portion 14, resulting from manufacturing errors and to improve the yield.

Moreover, according to the solid-state imaging device according to the second embodiment, the plurality of projections 36*b* are formed so that the line M connecting the distal ends of the plurality of projections 36*b* forms a mountain shape of which the apex is the distal end of the central projection 36*b*-1. Thus, it is possible to further suppress deterioration of the transfer characteristics of the electrical charges between the second transfer gate portions 15*b* and 15*c* and the offset gate portion 14, resulting from manufacturing errors as compared to the solid-state imaging device 10 according to the first embodiment and to further improve the yield.

Although the solid-state imaging devices according to the first and second embodiments described hereinabove are applied to CCD image sensors, the present invention can be also applied to CMOS image sensors.

Third Embodiment

Figure 20:
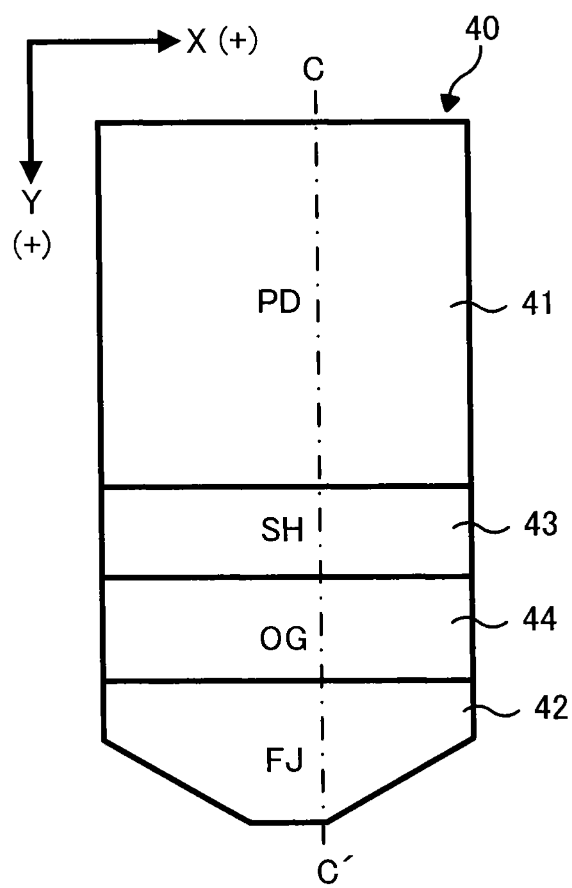
FIG. 20 is a plan view schematically illustrating main components of a solid-state imaging device according to a third embodiment.

FIG. 20 is a plan view schematically illustrating main components of a solid-state imaging device according to a third embodiment. The solid-state imaging device illustrated in FIG. 20 is a part of a CMOS image sensor. In a practical CMOS image sensor, a plurality of structures illustrated in FIG. 20 are arranged in a grid form.

As illustrated in FIG. 20, in this solid-state imaging device 40, a transfer gate portion (SH) 43 and an offset gate portion 44 are formed between a pixel portion (PD) 41 and a charge detecting portion (FJ) 42. The pixel portion 41 and the charge detecting portion 42 perform the same operations as the pixel portions 11*a* to 11*d* and the charge detecting portion 16 of the solid-state imaging devices according to the first and second embodiments. In contrast, the transfer gate portion (SH) 43 reads electrical charges generated in the pixel portion 41 and transfers the read electrical charges to the charge detecting portion 42 via the offset gate portion 44.

Figure 21:
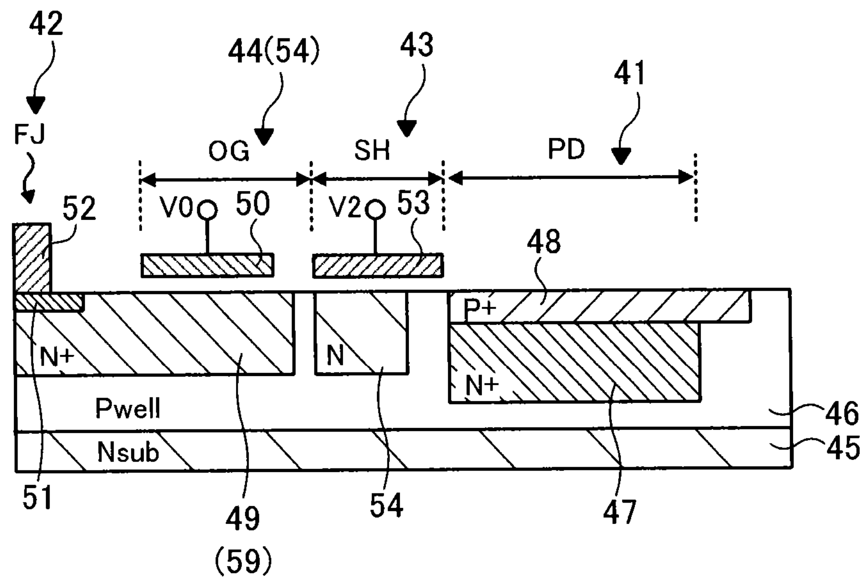
FIG. 21 is a cross-sectional view of the solid-state imaging device along one-dot chain line C-C' of FIG. 20.

FIG. 21 is a cross-sectional view of the solid-state imaging device 40 along one-dot chain line C-C' of FIG. 20. As illustrated in FIG. 21, the pixel portion (PD) 41, the transfer gate portion (SH) 43, the offset gate portion (OG) 44, and the charge detecting portion (FJ) 42 are formed in a P type well layer 46 formed on an N type semiconductor substrate 45, for example.

In the pixel portion 41, a light receiving layer 47 which is an N+ type impurity layer, for example, is formed on a surface of the well layer 46. Moreover, a shield layer 48 for a light receiving layer which is a P+ type impurity layer, for example, and shields the light receiving layer 47 is formed on a surface of the light receiving layer 47. Moreover, the semiconductor substrate 45 may be a P type substrate, and the well layer 46 may be an N type layer.

In the charge detecting portion 42 and the offset gate portion 44, an offset gate layer 49 which is an N+ type impurity layer, for example, is formed on the surface of the well layer 46.

In the offset gate portion 44, an offset gate electrode 50 is formed on a portion of the surface of the offset gate layer 49. Moreover, in the charge detecting portion 42, a charge detecting layer 51 which is an impurity layer (for example, an N++ type impurity layer) of a higher concentration than the offset gate layer 49 is formed on the surface of the offset gate layer 49. Moreover, a readout electrode 52 is formed on the surface of the charge detecting layer 51.

Figure 22:
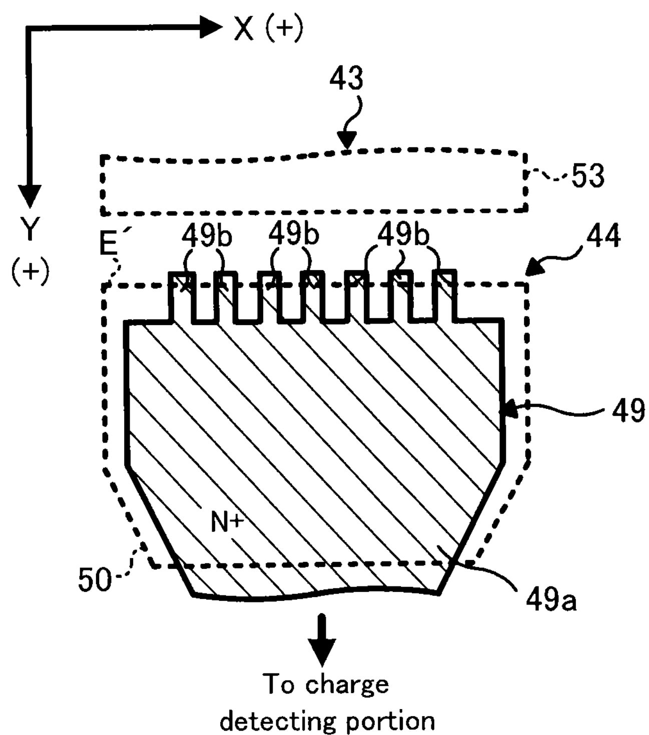
FIG. 22 is a plan view schematically illustrating an offset gate portion of the solid-state imaging device according to the third embodiment and the periphery thereof.

FIG. 22 is a plan view schematically illustrating the offset gate portion 44 and the periphery thereof. In FIG. 22, the offset gate electrode 50 and a transfer electrode 53 described later are depicted by dot lines. Hereinafter, the structure of the offset gate portion 44 will be described in further detail with reference to FIG. 22.

As illustrated in FIG. 22, the offset gate layer 49 has a convex shape and is formed such that a convex portion 49*a* faces the charge detecting portion 42. In this offset gate layer 49, a long side portion (a region adjacent to the transfer gate portion 43) opposite the convex portion 49*a* has a comb-shape similarly to the offset gate layer 26 (FIG. 4) of the solid-state imaging device 10 according to the first embodiment. That is, a plurality of projections 49*b* of the same length are formed on one side of the offset gate layer 49 adjacent to the transfer gate portion 43 so as to be separated from each other.

Similarly to the plurality of projections 26*b* formed on the offset gate layer 26 of the solid-state imaging device 10 according to the first embodiment, the plurality of projections 49*b* are formed so as to allow electrical charges to be transferred effectively and speedily in the offset gate portion and to suppress deterioration of the transfer characteristics of the electrical charges between the transfer gate portion 43 and the offset gate portion 44, resulting from manufacturing errors. However, the number of projections 49*b*, the distance between the projections 49*b*, and the length and width of the projection 49*b* may be optimized for each product through simulation or the like.

An offset gate electrode 50 is formed on the surface of the well layer 46, including such an offset gate layer 49. The offset gate electrode 50 is formed, for example, such that a long side E' which is one side of this electrode 50 overlaps the projection 49*b* as illustrated in the drawing. However, the formation position of the offset gate electrode 50 is not limited to this position but may be formed on the offset gate layer 49 including the plurality of projections 49*b*. The position of the offset gate electrode 50 in relation to the offset gate layer 49 may be optimized for each product by way of simulation or the like.

Figure 23:
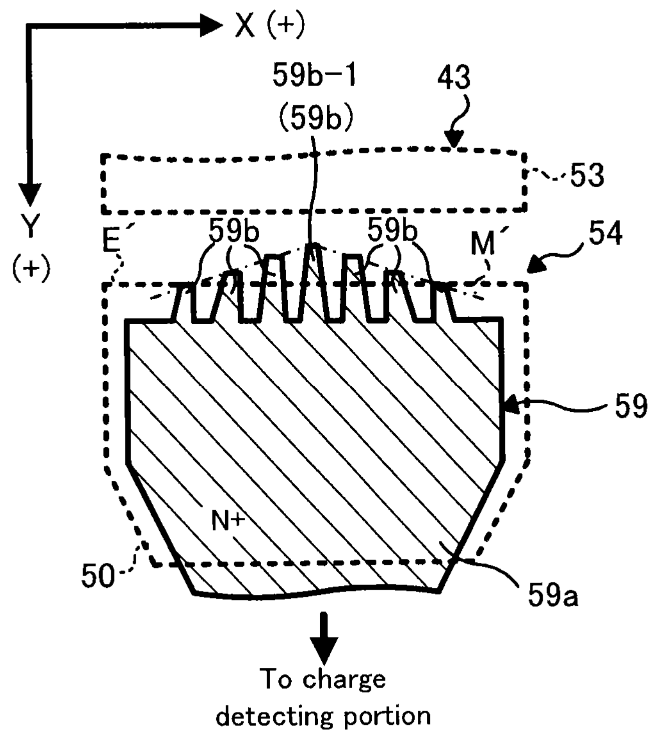
FIG. 23 is a plan view illustrating a modification example of the offset gate portion of the solid-state imaging device according to the third embodiment.

FIG. 23 illustrates a modification example of the offset gate portion. In an offset gate portion 54 according to the modification example, a plurality of projections 59*b* formed in a long side portion opposite the convex portion 59*a* of the offset gate layer 59 may be formed such that a line M' connecting the distal ends of the plurality of projections 59*b* forms a mountain shape of which the apex is the distal end of the central projection 59*b*-1 similarly to the offset gate layer 36 (FIG. 15) of the solid-state imaging device according to the second embodiment.

FIG. 21 will be referenced. In such a transfer gate portion 43 between the offset gate portion 44 and the pixel portion 41, the transfer impurity layer 54 is formed on the surface of the well layer 46, and the transfer electrode 53 is formed on the surface of the well layer 46, including the impurity layer 54.

Such a solid-state imaging device 40 operates basically in the same manner as the solid-state imaging devices according to the first and second embodiments. That is, when a predetermined voltage is applied to the transfer electrode 53 so that the electric potential of the transfer gate portion 43 is deeper than the electric potential of the pixel portion 41, the electrical charges generated in the pixel portion 41 are transferred to the charge detecting portion 42 via the offset gate portion 44. The transferred electrical charges lower the electric potential of the charge detecting portion 42. The voltage drop is read by the readout electrode 52 as a signal voltage. The solid-state imaging device 40 forms a signal voltage for forming an image in this manner.

In such a solid-state imaging device 40 according to the third embodiment, similarly to the solid-state imaging device 10 according to the first embodiment, the plurality of projections 49*b* illustrated in FIG. 22 are formed on the offset gate layer 49. Thus, it is possible to allow the electrical charges to be transferred effectively and speedily in the offset gate portion 44. Further, it is possible to suppress deterioration of the transfer characteristics of the electrical charges between the transfer gate portion 43 and the offset gate portion 44, resulting from manufacturing errors and to improve the yield.

Further, as illustrated in FIG. 23, when the plurality of projections 59*b* are formed such that the line M' connecting the distal ends thereof forms a mountain shape of which the apex is the distal end of the central projection 59*b*-1, it is possible to further suppress deterioration of the transfer characteristics of the electrical charges between the transfer gate portion 43 and the offset gate portion 54 and to further improve the yield.

The solid-state imaging devices according to the first to third embodiments described hereinabove are applied to line sensors, for example. Hereinafter, a line sensor to which the solid-state imaging device 10 according to the first embodiment is applied will be described as an application example.

Application Example

Figure 24:
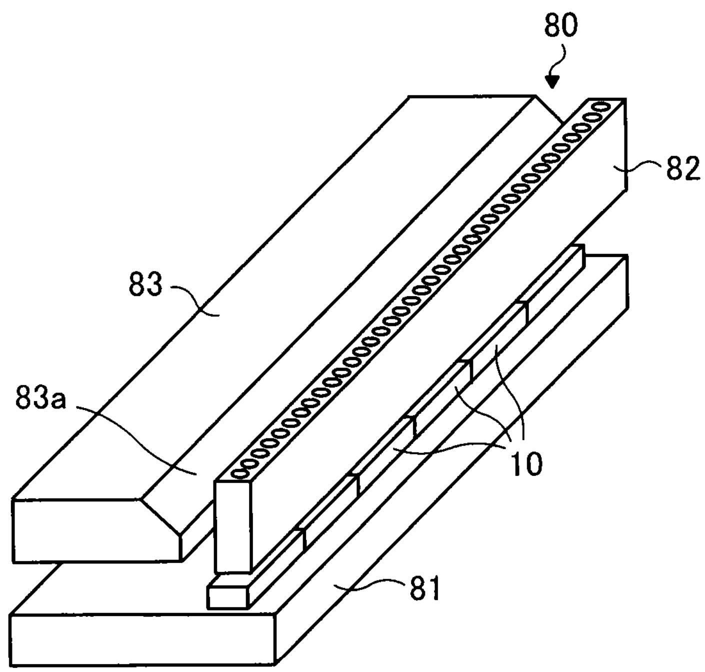
FIG. 24 is a perspective view illustrating a line sensor to which the solid-state imaging device according to the first embodiment is applied.

FIG. 24 is a perspective view illustrating a line sensor to which the first solid-state imaging device 10 is applied. A line sensor 80 includes a circuit board 81, a plurality of solid-state imaging devices 10, a SELFOC lens array 82, and a light guiding member 83. Although not illustrated in the drawing, these components are disposed in a housing.

The plurality of solid-state imaging devices 10 are disposed on the circuit board 81 in a straight line form so as to be adjacent to each other. Each solid-state imaging device 10 is disposed on the circuit board 81 so that a light receiving surface faces an output surface of the SELFOC lens array 82, and is electrically connected to wires formed in the circuit board 81.

Although not illustrated in the drawing, the circuit board 81 has an image processing circuit that forms an image based on the signal voltage output from each solid-state imaging device 10.

The SELFOC lens array 82 and the light guiding member 83 are disposed above the circuit board 81 and are supported by the housing (not illustrated). The light guiding member 83 has a light emission surface 83*a* for emitting light emitted from a light source (not illustrated) such as an LED disposed at an end of the light guiding member 83 toward an original document.

The SELFOC lens array 82 is disposed above the circuit board 81 so as to allow the light reflected from the original document to be formed by the solid-state imaging device 10. Thus, the light emitted from the light emission surface 83*a* of the light guiding member 83 is reflected from the original document to enter the SELFOC lens array 82, and is imaged by the solid-state imaging device 10.

Figure 25:
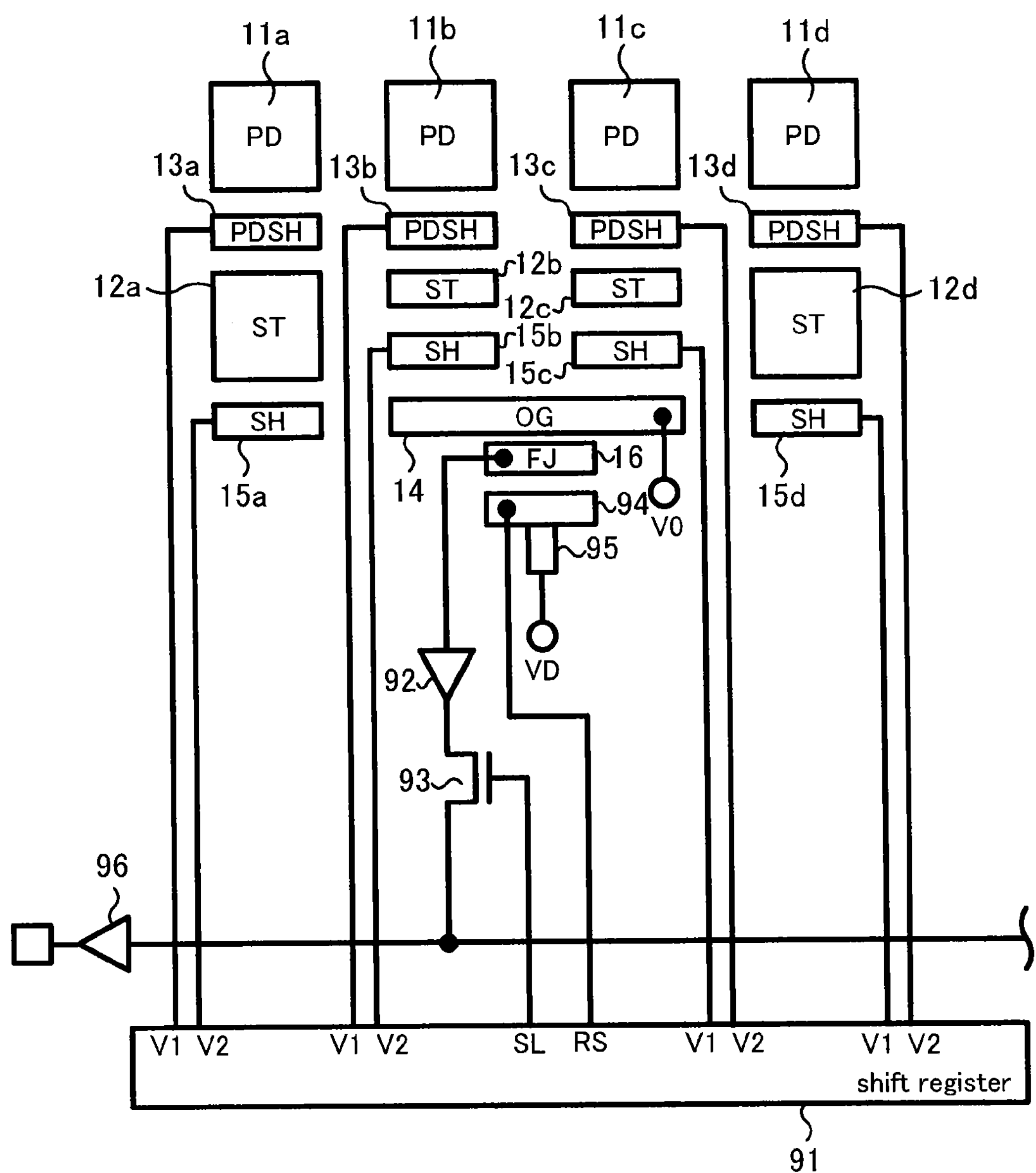
FIG. 25 is a circuit block diagram of one solid-state imaging device applied to the line sensor illustrated in FIG. 24.

FIG. 25 illustrates a circuit block diagram of one solid-state imaging device 10 applied to such a line sensor 80. The circuit block diagram illustrated in FIG. 25 is a circuit block diagram for one cell formed in the solid-state imaging device 10. In a practical solid-state imaging device, the circuit block diagrams illustrated in FIG. 25 are arranged.

As illustrated in FIG. 25, first transfer gate portions 13*a* to 13*d* and second transfer gate portions 15*a* to 15*d* are connected to a shift register 91. A gate pulse V1 output from the shift register 91 is input to the first transfer gate portions 13*a* and 13*d* at a desired point in time, and a gate pulse V2 output from the shift register 91 is input to the second transfer gate portions 15*a* to 15*d* at a desired point in time.

For example, when the gate pulse V1 is input to the four first transfer gate portions 13*a* to 13*d* at the same point in time and the gate pulse V2 is input to the four second transfer gate portions 15*a* to 15*d* at the same point in time, all electrical charges generated in the respective pixel portions 11*a* to 11*d* are transferred to and stored in the charge detecting portion 16. In this way, since the four pixel portions 11*a* to 11*d* can be regarded as one pixel, cell sensitivity can be increased.

On the other hand, when the gate pulse V1 is input to the four first transfer gate portions 13*a* to 13*d* at different points in time and the gate pulse V2 is input to the four second transfer gate portions 15*a* to 15*d* at different points in time, the electrical charges of the respective pixel portions 11*a* to 11*d* are transferred to and stored in the charge detecting portion 16 at different points in time. In this way, since the four pixel portions 11*a* to 11*d* can be regarded as different pixel portions, cell resolution can be increased.

That is, this solid-state imaging device can change the cell sensitivity and the cell resolution by controlling the points in time at which the gate pulses V1 and V2 are applied.

Moreover, a transistor 93 is connected to the charge detecting portion 16 with an amplifier 92 interposed. This transistor 93 is a select transistor for selecting one of a plurality of cells arranged in the solid-state imaging device 10. The gate of the select transistor 93 is connected to the shift register 91, and a select pulse SL output from the shift register 91 is input to the gate of the select transistor 93 at a desired point in time.

Further, a reset gate portion 94 and a drain 95 to which a constant voltage VD is applied are connected in that order to the charge detecting portion 16. The reset gate portion 94 is a gate for transferring unnecessary electrical charges stored in the charge detecting portion 16 to the drain 95 to reset the charge detecting portion 16. The reset gate portion 94 is connected to the shift register 91, and a reset pulse RS output from the shift register 91 is input to the reset gate portion 94 at a desired point in time.

In such a solid-state imaging device, when the electrical charges is stored in the charge detecting portion 16, the signal voltage detected by the charge detecting portion 16 is input to the select transistor 93. Here, when the select pulse SL is input from the shift register 91 to the gate of the select transistor 93, the signal voltage input to the select transistor 93 is input to the amplifier 96 via the select transistor 93, which amplifies and outputs the signal voltage.

On the other hand, unnecessary electrical charges stored in the charge detecting portion 16 after the charge detecting portion 16 detects the signal voltage are transferred to the drain 95 when the reset pulse RS is input from the shift register 91 to the reset gate portion 94 to turn on the reset gate portion 94. In this way, the charge detecting portion 16 is reset.

Each solid-state imaging device 10 formed in the line sensor 80 illustrated in FIG. 24 generates a signal voltage when the respective cells formed in this device performs the operations described with reference to FIG. 25. The generated signal voltage is transmitted to the circuit board 81, and the image processing circuit formed on the circuit board 81 forms an image. The line sensor 80 forms an image in this manner.

While certain embodiments have been described, these embodiments have been presented through example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

For example, although the solid-state imaging devices according to the embodiments described above are formed in the P type well layer 18 or 46 formed on the N type semiconductor substrate 17 or 45, the solid-state imaging devices may not always be formed in the well layer 18 or 46 but may be formed on the P type semiconductor substrate.

What is claimed is:

1. A solid-state imaging device comprising:

a pixel portion generating electrical charges according to an amount of received incident light;

a charge storage portion storing the electrical charges generated in the pixel portion;

a first transfer gate portion reading the electrical charges from the pixel portion and transferring the electrical charges to the charge storage portion;

a charge detecting portion to which the electrical charges stored in the charge storage portion are transferred and which causes a voltage drop corresponding to the amount of the transferred electrical charges to occur;

a second transfer gate portion reading the electrical charges stored in the charge storage portion and transferring the electrical charges to the charge detecting portion; and an offset gate portion provided between the second transfer gate portion and the charge detecting portion and applied with a predetermined constant voltage, wherein the offset gate portion includes an offset gate layer that is provided on a surface of a semiconductor substrate and has a plurality of projections at positions adjacent to the second transfer gate portion and an offset gate electrode that is formed on a surface of the semiconductor substrate, including the offset gate layer.

2. The solid-state imaging device according to claim 1, wherein the plurality of projections have the same length with each other.

3. The solid-state imaging device according to claim 1, wherein the plurality of projections have different lengths with each other.

4. The solid-state imaging device according to claim 3, wherein the plurality of projections are formed such that a line connecting distal ends of these projections forms a mountain shape.

5. The solid-state imaging device according to claim 1, wherein the offset gate layer is an impurity layer having an n-conductivity type.

6. The solid-state imaging device according to claim 1, comprising a plurality of the pixel portions, a plurality of the charge storage portions, a plurality of the first transfer gate portions, and a plurality of the second transfer gate portions, wherein the plurality of the pixel portions are arranged in a line form, wherein each of the plurality of the pixel portions has a shape of which a longitudinal direction is the arrangement direction of the plurality of pixel portions, the plurality of the charge storage portions are arranged in a line form in parallel to the arrangement direction of the plurality of pixel portions, and the offset gate portion has a shape which has long sides extending in a longitudinal direction which is the arrangement direction of the plurality of pixel portions and short sides extending in a direction substantially perpendicular to the longitudinal direction, wherein the offset gate portion is provided between the plurality of second transfer gate portions and the charge detecting portion so that the long sides are adjacent to the plurality of second transfer gate portions.

7. The solid-state imaging device according to claim 6, wherein the plurality of projections are formed on one side of the offset gate layer parallel to the longitudinal direction of the pixel portion.

8. A solid-state imaging device comprising:

a pixel portion generating electrical charges according to an amount of received incident light;

a charge detecting portion to which the electrical charges generated in the pixel portion are transferred and which causes a voltage drop corresponding to the amount of the transferred electrical charges to occur;

a transfer gate portion reading the electrical charges stored in the pixel portion and transferring the electrical charges to the charge detecting portion; and an offset gate portion provided between the transfer gate portion and the charge detecting portion and applied with a predetermined constant voltage, wherein the offset gate portion includes an offset gate layer that is provided on a surface of a semiconductor substrate and has a plurality of projections at positions adjacent to the transfer gate portion and an offset gate electrode that is formed on a surface of the semiconductor substrate, including the offset gate layer.

9. The solid-state imaging device according to claim 8, wherein the plurality of projections have the same length with each other.

10. The solid-state imaging device according to claim 8, wherein the plurality of projections have different lengths with each other.

11. The solid-state imaging device according to claim 10, wherein the plurality of projections are formed such that a line connecting distal ends of these projections forms a mountain shape.

12. The solid-state imaging device according to claim 8, wherein the offset gate layer is an impurity layer having an n-conductivity type.

13. A line sensor comprising:

a circuit board;

a plurality of solid-state imaging devices disposed in a straight line form on a surface of the circuit board;

a light guiding member disposed above the surface of the circuit board so as to emit light to a subject; and a lens array disposed above the surface of the circuit board so as to focus the light reflected from the subject on the plurality of solid-state imaging devices, wherein each of the plurality of solid-state imaging devices includes:

a pixel portion generating electrical charges according to an amount of received incident light;

a charge storage portion storing the electrical charges generated in the pixel portion;

a first transfer gate portion reading the electrical charges from the pixel portion and transferring the electrical charges to the charge storage portion;

a charge detecting portion to which the electrical charges stored in the charge storage portion are transferred and which causes a voltage drop corresponding to the amount of the transferred electrical charges to occur;

a second transfer gate portion reading the electrical charges stored in the charge storage portion and transferring the electrical charges to the charge detecting portion; and an offset gate portion provided between the second transfer gate portion and the charge detecting portion and applied with a predetermined constant voltage, and wherein the offset gate portion includes an offset gate layer that is provided on a surface of a semiconductor substrate and has a plurality of projections at positions adjacent to the second transfer gate portion and an offset gate electrode that is formed on a surface of the semiconductor substrate, including the offset gate layer.

14. The line sensor according to claim 13, wherein the plurality of projections of the offset gate layer formed in the offset gate portion of the solid-state imaging device have the same length with each other.

15. The line sensor according to claim 13, wherein the plurality of projections of the offset gate layer formed in the offset gate portion of the solid-state imaging device have different lengths with each other and are formed such that a line connecting distal ends of these projections forms a mountain shape.

* * * * *